(12) United States Patent
Liaw

(10) Patent No.: US 12,484,301 B2
(45) Date of Patent: Nov. 25, 2025

(54) SEMICONDUCTOR STRUCTURE WITH BACKSIDE POWER MESH AND METHOD OF FORMING THE SAME

(71) Applicant: TAIWAN SEMICONDUCTOR MANUFACTURING COMPANY LTD., Hsinchu (TW)

(72) Inventor: Jhon Jhy Liaw, Hsinchu County (TW)

(73) Assignee: TAIWAN SEMICONDUCTOR MANUFACTURING COMPANY LTD., Hsin-Chu (TW)

(*) Notice: Subject to any disclaimer, the term of this patent is extended or adjusted under 35 U.S.C. 154(b) by 680 days.

(21) Appl. No.: 17/819,053

(22) Filed: Aug. 11, 2022

(65) Prior Publication Data
US 2024/0055433 A1 Feb. 15, 2024

(51) Int. Cl.
*H10D 84/90* (2025.01)
*G06F 30/392* (2020.01)

(52) U.S. Cl.
CPC ......... *H10D 84/907* (2025.01); *G06F 30/392* (2020.01); *H10D 84/981* (2025.01)

(58) Field of Classification Search
CPC .................................................. H10D 84/981
See application file for complete search history.

(56) References Cited

U.S. PATENT DOCUMENTS

| | | |
|---|---|---|
| 10,090,325 B1 | 10/2018 | Liaw |
| 10,312,332 B2 | 6/2019 | Liaw |
| 10,515,967 B2 | 12/2019 | Liaw |

*Primary Examiner* — Amar Movva
(74) *Attorney, Agent, or Firm* — Cooper Legal Group, LLC

(57) ABSTRACT

A method includes forming a doped region extending in a first direction on a substrate; depositing a gate electrode over the substrate and extending in a second direction; and forming a source/drain region on one side of the doped region; forming a first power rail over an upper surface of the source/drain region, the first power rail extending in the first direction and electrically coupled to the source/drain region; and depositing a second power rail below a lower surface of the source/drain region, the second power rail extending in the first direction and electrically coupled to the source/drain region. The first power rail overlap the second power rail from a top-view perspective.

20 Claims, 31 Drawing Sheets

SEMICONDUCTOR STRUCTURE WITH BACKSIDE POWER MESH AND METHOD OF FORMING THE SAME

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the devices in electronic equipment in order to improve device robustness as well as reduce manufacturing cost and processing time.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
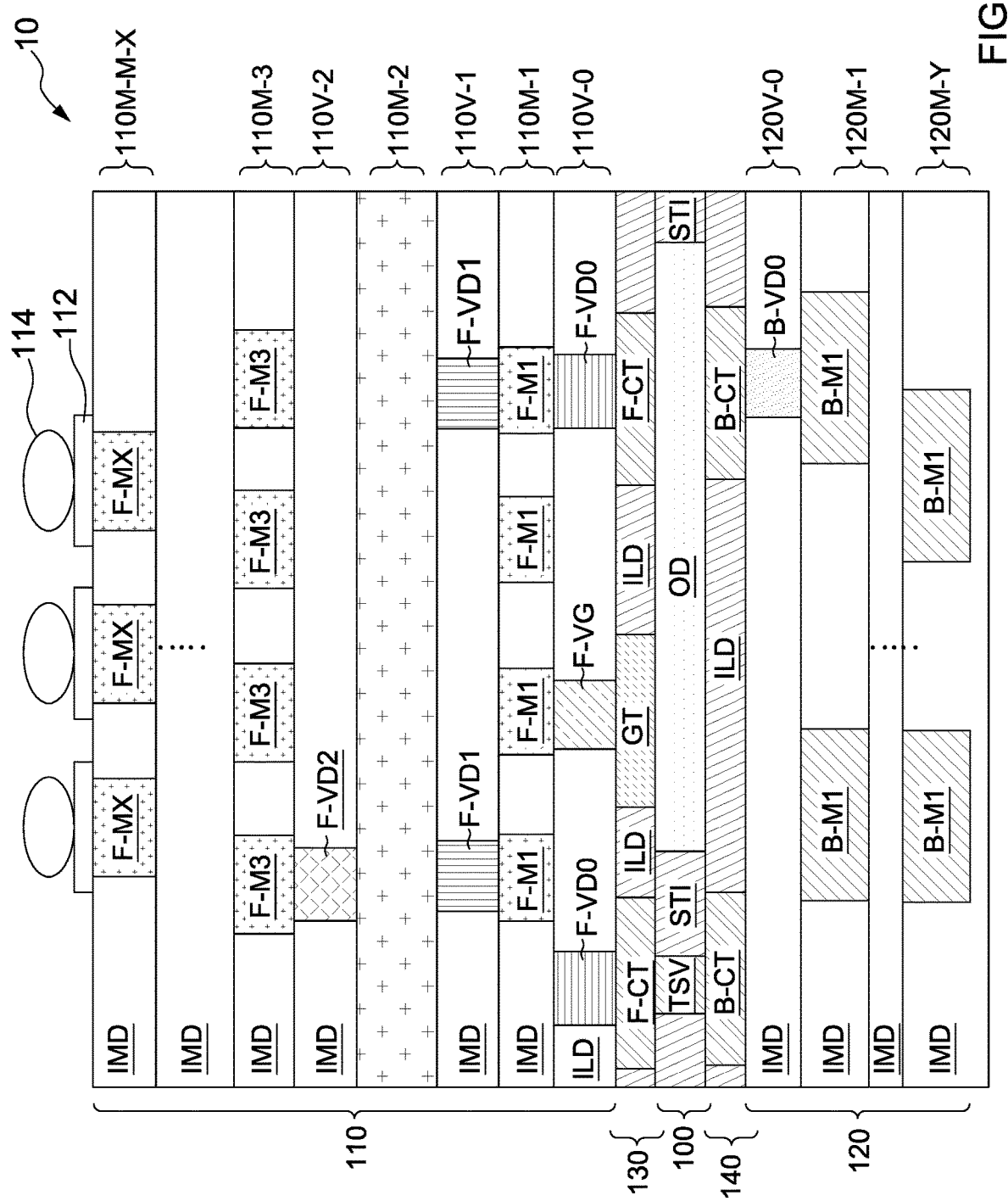
FIGS. 1A and 1B are cross-sectional views showing vertical layer arrangements of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell may include various patterns in one or more layers and may be expressed as unions of polygons. A design layout may be initially constructed by placement of an array of identical or different standard cells during the layout design stage. The geometries of the patterns in the cells may be adjusted at different stages of layout design in order to compensate for design and process effects. A standard cell may implement a portion or an entirety of an electronic circuit to be manufactured. The standard cells may be accessible from cell libraries provided by semiconductor circuit manufacturers or designers. Throughout the present disclosure, the standard cells are designed for implementing electronic circuits formed by semiconductor devices, e.g., a metal-oxide-semiconductor (MOS) device, and can be a planar field-effect transistor (FET), a fin-type FET (FinFET), a gate-all-around (GAA) FET, a nanosheet FET, a nanowire FET, a fully-depleted silicon-on-isolator (FDSOI) FET, or the like. In some embodiments, the standard cells are included in a standard cell library, which may be stored in a non-transitory computer-readable storage medium and accessed by a processor in a layout operation.

Embodiments of the present disclosure discuss a layout method and a layout system for improving area utilization and electrical properties of the power rails. Embodiments of the present disclosure also discuss a method of manufacturing a semiconductor device for implementing the aforesaid design layout. When a design layout associated with an electronic circuit is generated by placing a plurality of cells in the design layout and abutting some of the cells at suitable locations, multiple conductive lines are subsequently routed in conductive line layers to form a power mesh and supply power to the FETs in the cells. The routing performance, e.g., the power and transmission speed, of the power rails are closely related to the length, the width and pitch of the routed power rails. As the cell device size continues to decrease, the sizes and pitches of the power rails are also required to reduce proportionally. As a result, the resistance or capacitance of the power rails may not fulfill the design requirements, thereby causing the device performance to deteriorate.

A backside power rail scheme is proposed to address the abovementioned issues. The front-side area over the cell is used by conductive lines serving as signal lines, while the backside area below the cell is reserved for part or all of the power rails. The routing area for the power rails is enlarged accordingly, and the resistance or capacitance of the power mesh can be effectively reduced. The performance of the semiconductor devices can be maintained or even improved despite the reduction of device size.

FIG. 1A is a cross-sectional view showing vertical layer arrangements of a semiconductor device 10, in accordance with some embodiments of the present disclosure. A substrate layer 100 is formed or provided, in which a substrate (not shown in FIG. 1A, but labelled as "102" in FIG. 7A) is formed. The substrate may include silicon, germanium, or other suitable elementary semiconductor materials. Alternatively, the substrate may include a compound semiconductor, such as silicon carbide, gallium arsenide, indium arsenide, or indium phosphide. The substrate may include different dopant types, such as P-type substrate or an N-type substrate, and may include various doping configurations depending on design requirements. Further, the substrate may include an epitaxial layer (epi layer) or may include a silicon-on-insulator (SOI) structure.

An active region, denoted by "OD" in FIG. 1A, is arranged in the substrate layer 100 and exposed through an upper surface of the substrate. Although not separately shown, the active region OD may include a first source/drain region, a second source/drain region and a channel of a FET interposed between the two source/drain regions. The source/drain regions in the active region may be an N-type active region doped with N-type impurities such as arsenic, phosphorus, or the like, or a P-type active region doped with P-type impurities such as boron or the like. The channel in the active region OD may be undoped or lightly doped. Throughout the present disclosure, the source/drain region (s) may refer to a source or a drain, individually or collectively, dependent upon the context. In embodiments where a raised active region or a FinFFT is involved, the active region OD may have an upper surface higher than the upper surface of the substrate. In some embodiments, the substrate layer 100 further includes isolation structures STI defining and laterally surrounding the active region OD. In some embodiments, the isolation structures STI are formed of dielectric materials, such as oxide, nitride, carbide, oxynitride, a combination thereof, or the like, and may be referred to as shallow trench isolation (STI).

A gate structure, denoted by "GT" in FIG. 1A, is formed in a gate layer 130 over the substrate layer 100. The gate structure GT includes a gate dielectric layer and a gate electrode (not separately shown). The gate dielectric layer may be formed of dielectric materials, such as oxide, nitride, or high-k dielectric material, and arranged between the channel and the gate electrode. The gate electrode may include a conductive material, such as doped polysilicon or a metal gate comprising metallic materials such as tungsten, and cobalt, and other work function adjusting metals, such as Ti, Al, TiAl, TiN, TaC, and the like. In embodiments where a FinFFT or a GAA FET is adopted, the gate structure GT may overlap the active region in the vertical direction (Z-axis). For example, in a GAA FET, the active region OD is formed of multiple nanosheets or nanowires, and each of the nanosheets or nanowires is wrapped around by the gate structure GT. The two sides of the nanosheets or nanowires are covered by the source/drain regions.

The gate structure GT may be classified into a functional gate structure and a non-functional gate structure. The functional gate structure serves as the gate terminal of a FET and configured to receive a gate control biasing voltage. The non-functional gate structure is not part of any FET, but serves as an isolation structure between neighboring FETs. The gate electrode GT of the non-functional gate structure may be replaced by a dielectric material, or its conductive gate electrode is a tied-off gate electrode such that the function of the gate electrode is disabled.

A front-side gate-layer conductive line, denoted by "F-CT" in FIG. 1A, is also arranged in the gate layer 130 over the active region OD adjacent to the gate structure GT. The front-side gate-layer conductive line F-CT is configured as a front-side contact of the source/drain region over the active region OD. In some embodiments, the front-side gate-layer conductive line F-CT extends in the direction of the Y-axis and is parallel to the direction where the gate structure GT extends. Likewise, a backside conductive line, denoted by "B-CT" in FIG. 1A, is also arranged in a backside contact layer 140 below the substrate layer 100. The backside conductive line B-CT is configured as a backside contact of the source/drain regions below the active region OD. In some embodiments, the backside conductive line B-CT extends in the direction of the Y-axis and is parallel to the direction where the gate structure GT extends.

The semiconductor device 10 includes a front-side interconnect structure 110 and a backside interconnect structure 120 on two sides of the substrate layer 100. In some embodiments, the front-side interconnect structure 110 is arranged over the gate layer 130 and configured to electrically interconnect the terminals of the FETs in the substrate layer 100 and the gate layer 130, or electrically connect the front-side gate-layer conductive lines F-CT of the gate layer 130 to the conductive members in the overlying layers above the front-side interconnect structure 110. Likewise, the semiconductor device 10 further includes a backside interconnect structure 120 below the backside contact layer 140, and configured to electrically interconnect the terminals of the FETs in the substrate layer 100 and the gate layer 130, or electrically connect the backside conductive lines B-CT in the backside contact layer 140 to the conductive elements in the underlying layers below the backside interconnect structure 120. In some embodiments, one of the front-side interconnect structure 110 and the backside interconnect structure 120, or both, includes a power mesh configured to provide working voltages and ground to the terminals of the FETs in the substrate layer 100 and the gate layer 130.

In some embodiments, the semiconductor device 10 includes a through-substrate via, denoted by "TSV" in FIG. 1A, extending through the substrate layer 100 and electrically connecting the front-side gate-layer conductive line F-CT to the backside conductive line B-CT. The through-substrate via TSV is configured to form a conduction path electrically connecting the front-side interconnect structure 110 to the backside interconnect structure 120 in additional to the conduction path formed through the active region OD.

The abovementioned front-side conductive lines F-CT, backside conductive lines B-CT and through-substrate via TSV may be formed of conductive materials, e.g., doped silicon or metallic materials, such as copper, tungsten, titanium, aluminum, tantalum, alloys thereof, or the like. In some embodiments, the isolation structures STI are arranged in the substrate layer 100 for electrically insulating the abovementioned conductive members. In some embodiments, the semiconductor device 10 includes interlayer dielectric (ILD) layer in the gate layer 130 or the backside contact layer 140 to electrically insulating the gate structure GT, the front-side gate-layer conductive lines F-CT or the backside conductive lines B-CT. The ILD layer may be formed of oxide, nitride, oxynitride, carbide, a combination thereof, or the like.

The front-side interconnect structure 110 includes a plurality of front-side conductive line layers 110M and a plurality of front-side conductive via layers 110V over the gate layer 130. The labels of the individual front-side conductive line layers 110M are appended with layer indices x, where x is a natural number, e.g., 110M-1, 110M-2, 110M-3. The uppermost front-side conductive layer 110M is labelled as 110M-X. Similarly, the labels of individual front-side conductive via layers 110V are appended with layer indices x (the index of the front-side conductive via layer 110V starts from zero), e.g., 110V-0, 110V-1 and 110V-2. The front-side conductive line layers 110M-x are arranged alternatively with the front-side conductive via layers 110V-x.

Each of the front-side conductive line layers 110M-x includes a plurality of parallel conductive lines F-Mx, and each of the front-side conductive via layers 110V-x includes conductive vias, e.g., a gate via "F-VG" or a drain via "F-VDx." In some embodiments, the odd-numbered front-side conductive lines F-Mx, e.g., F-M1 and F-M3, extend in the Y-axis, while the even-numbered front-side conductive lines F-Mx, e.g., F-M2, extend in the X-axis, or vice versa. The adjacent front-side conductive lines F-Mx and F-M(x−1) are electrically interconnected through the intervening front-side conductive via F-VD(x−1). For example, the front-side conductive line layer 110M-2 is electrically connected to front-side conductive line layer 110M-3 through the front-side conductive via layer 110V-2. Furthermore, the bottommost front-side conductive via F-VD0 electrically connects the front-side conductive line F-M1 to the front-side gate-layer conductive line F-CT.

The front-side conductive lines F-Mx and the front-side conductive vias F-VG and F-VDx may be formed of conductive materials, such as copper, tungsten, aluminum, titanium, tantalum, alloys thereof, or the like, and may be electrically insulated by an inter-metal dielectric (IMD) layer. The IMD layer may be formed of a dielectric material, such as silicon oxide, silicon nitride, silicon oxynitride, silicon carbide, combinations thereof, or the like.

The backside interconnect structure 120 includes a plurality of backside conductive line layers 120M and a plurality of backside conductive via layers 120V below the backside contact layer 140. The labels of the individual backside conductive line layers 120M are appended with layer indices y, where y is a natural number, with the bottommost backside conductive line layer labelled as 120M-Y. Similarly, the labels of individual backside conductive via layers 120V are appended with layer indices y, where w is zero or a natural number, e.g., 120V-0. The backside conductive line layers 120M-y are arranged alternatively with the backside conductive via layers 120V-y.

Each of the backside conductive line layers 120M-y includes a plurality of parallel conductive lines B-My, and each of the backside conductive via layers 120V-y includes conductive vias B-VDy. The backside conductive line layers 120M-y are electrically interconnected through the intervening conductive via layers 120V-y in a manner similar to that of the front-side conductive lines layers 110M-x and front-side conductive via layers 110V-x. The backside conductive lines B-My and the backside conductive vias B-VDy may be formed of conductive materials, such as copper, tungsten, aluminum, titanium, tantalum, alloys thereof, or the like, and may be electrically insulated by an inter-metal dielectric (IMD) layer. The IMD layer may be formed of a dielectric material, such as silicon oxide, silicon nitride, silicon oxynitride, silicon carbide, combinations thereof, or the like.

In some embodiments, the front side refers to the side of the substrate layer 100 in which the gate structure GT or the gate via VG resides. In some embodiments, the front side refers to the side of the substrate layer 100 in which the gate structure GT or the gate via VG extends outwardly from the substrate layer 100. In some embodiments, the backside refers to the side of the substrate layer 100 opposite to the front side of the substrate layer 100.

The number of layers, configurations and materials of the front-side interconnect structure 110 and the backside interconnect structure 120 shown in FIG. 1A are for illustrative purposes only. Other numbers of conductive line layers or conductive via layers, materials, and configurations of the front-side interconnect structure 110 or backside interconnect structure 120 are also within the contemplated scope of the present disclosure.

Referring to FIG. 1A, in some embodiments, the semiconductor device 10 includes conductive pads 112 and connectors 114 arranged on the upper surface of the front-side interconnect structure 110, and referred to as front-side bond pads. The conductive pads 112 may include aluminum, copper, tin, silver, gold, solder-based materials, or other suitable conductive materials. In some embodiments, the conductive pads 112 include a multilayer structure. The connectors 114 may be contact bumps, such as controlled collapse chip connection (C4) bumps, ball grid array bumps or microbumps, and configured to electrically connect the semiconductor device 10 to external devices through the conductive pads 112. In some embodiments, the backside interconnect structure 120 may be electrically connected to the connectors 114 through the conductive pads 112, the front-side interconnect structure 110, the active region OD or the through-substrate via TSV.

Figure 1B:
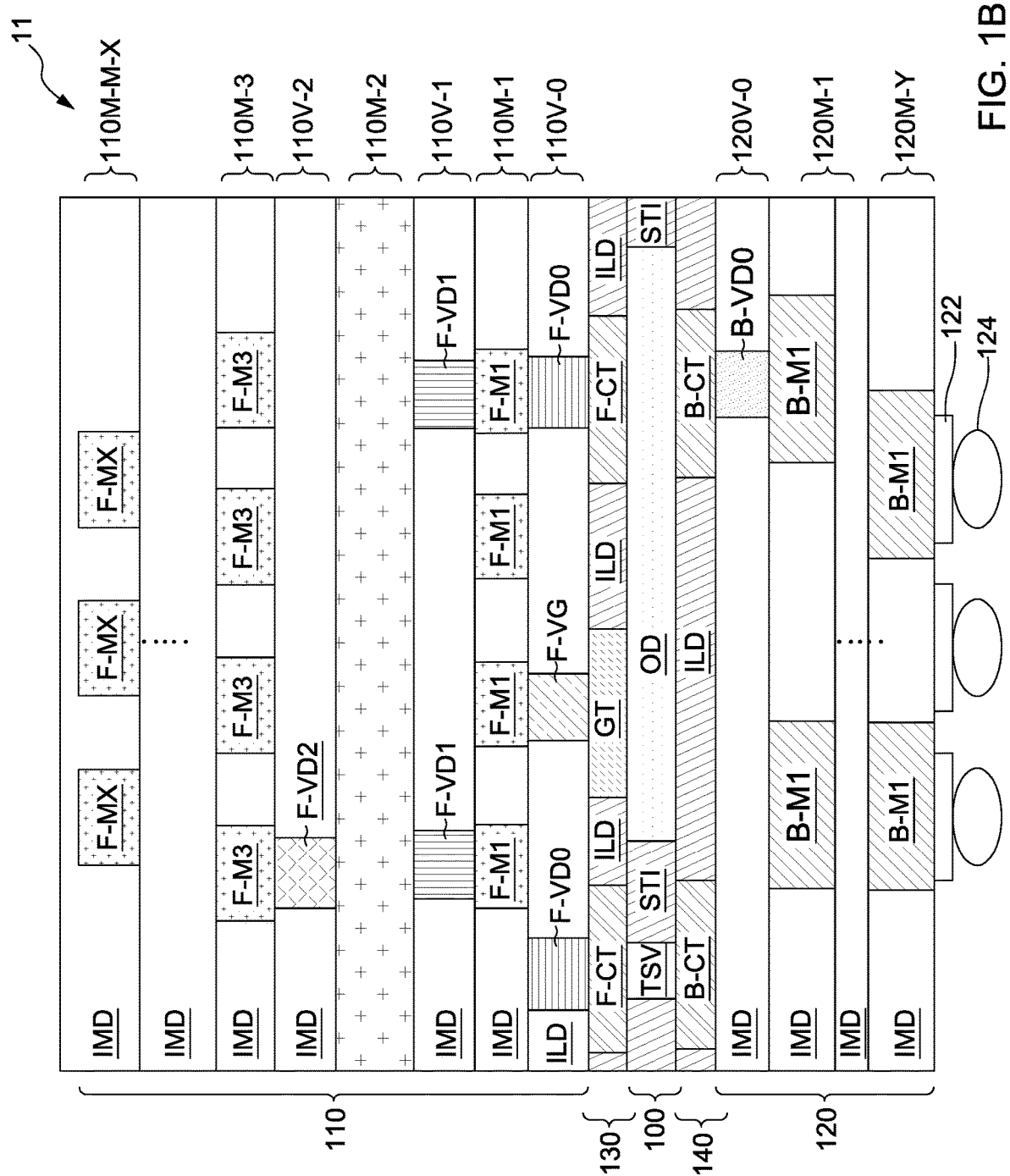

FIG. 1B is a cross-sectional view showing vertical layer arrangements of a semiconductor device 11, in accordance with some embodiments of the present disclosure. The semiconductor device 11 is similar to the semiconductor device 10 in many aspects, and thus the similar aspects will not be repeated for brevity. The semiconductor device 11 is different from the semiconductor device 10 in that the semiconductor device 11 includes conductive pads 122 and connectors 124 arranged on the lower surface of the semiconductor device 11 below the backside interconnect structure 120, and referred to as backside bond pads. The connectors 124 may be contact bumps such as C4 bumps, ball grid array bumps or microbumps, and configured to electrically connect the semiconductor device 11 to external devices through the conductive pads 122. The materials, configurations and dimensions of the conductive pads 122 and the connectors 124 are similar to those of the conductive pads 112 and the connectors 114.

Figure 2A:
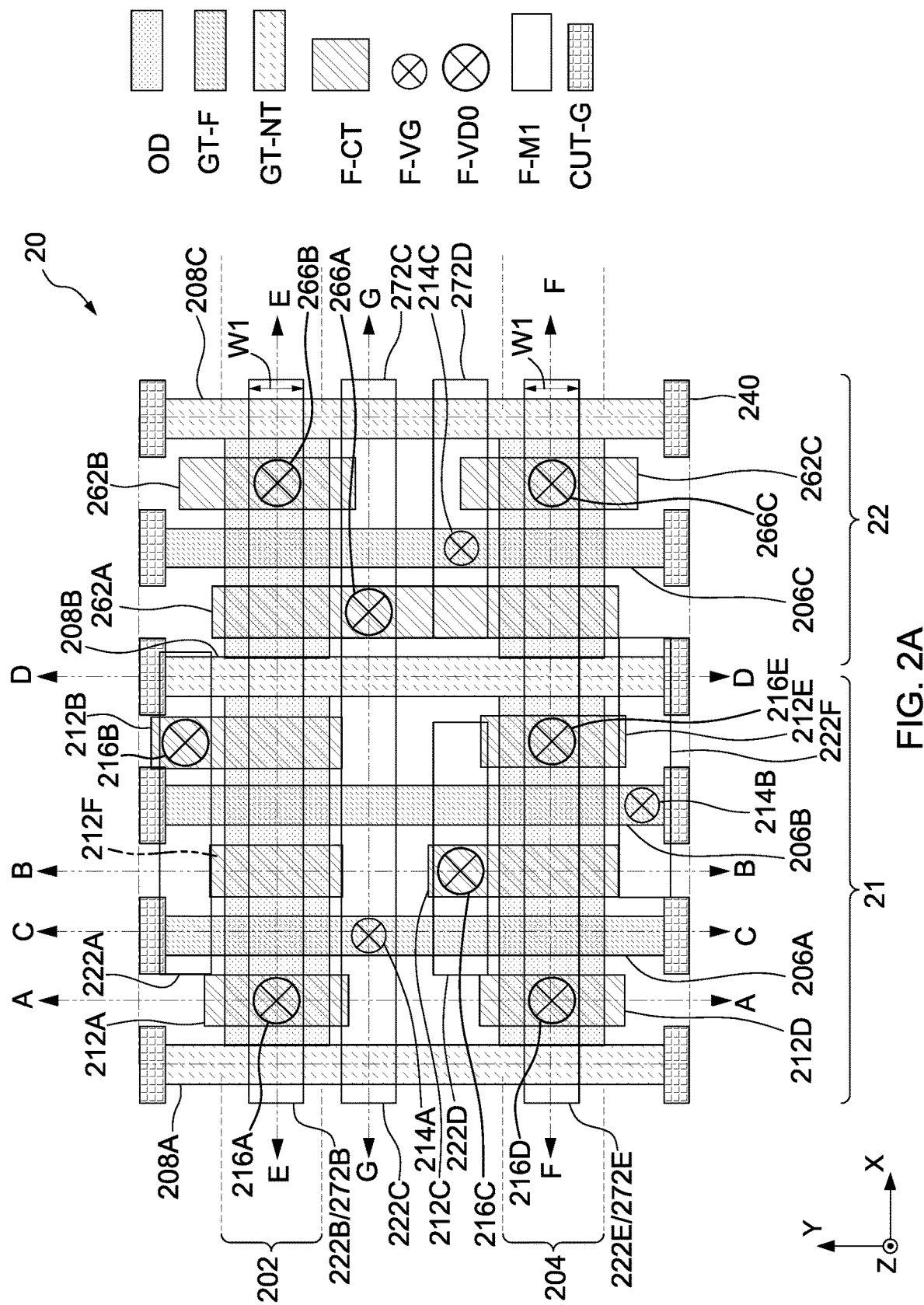
FIGS. 2A and 2B show a top view and a bottom view, respectively, of a design layout associated with an electronic circuit, in accordance with some embodiments of the present disclosure.
Figure 2B:
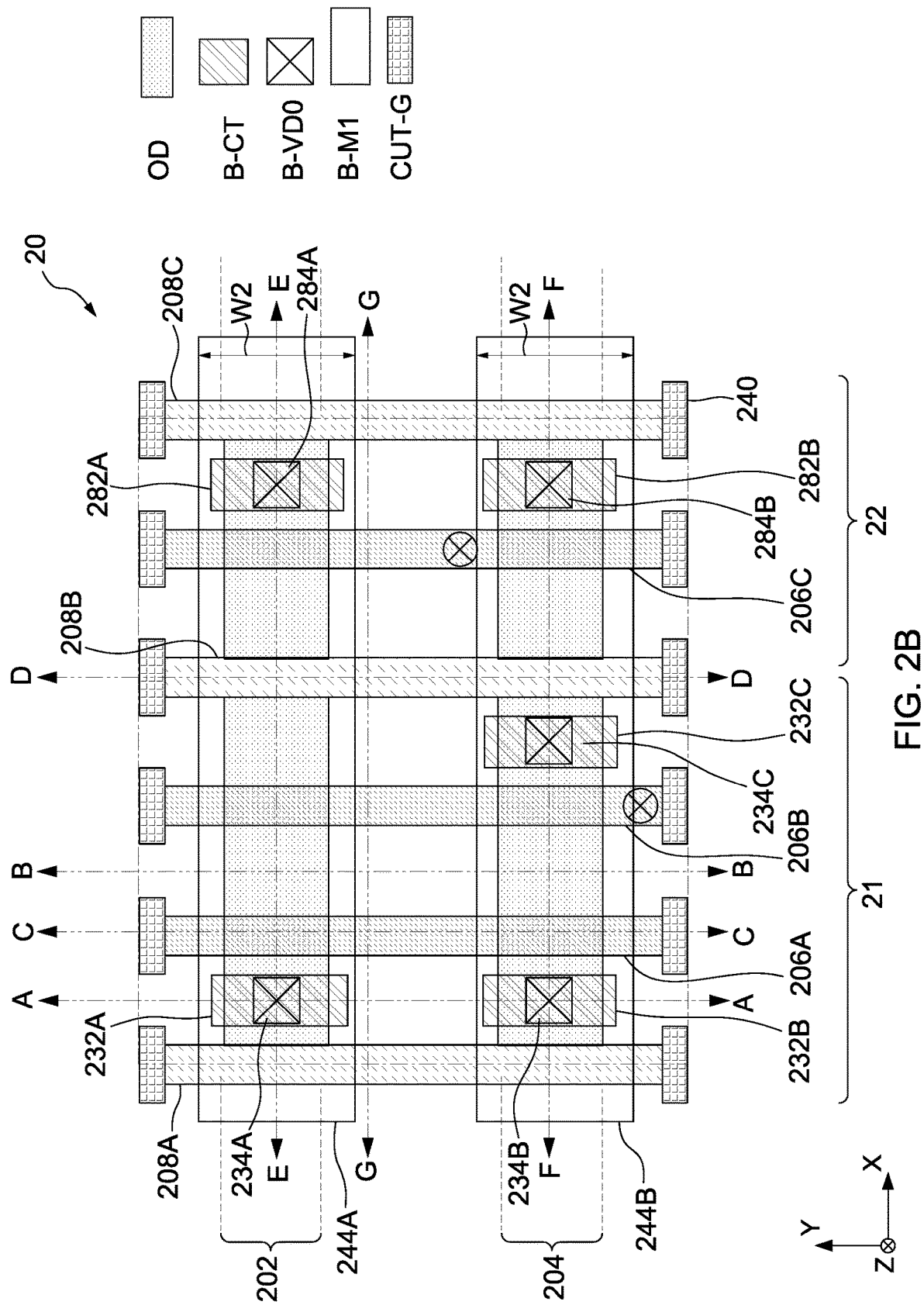

FIGS. 2A and 2B show a top view and a bottom view, respectively, of a design layout of a semiconductor device 20 associated with an electronic circuit, in accordance with some embodiments of the present disclosure. FIGS. 3A, 3B, 3C, 3D, 3E, 3F and 3G show cross-sectional views of the semiconductor device 20 shown in FIGS. 2A and 2B along section lines AA, BB, CC, DD, EE, FF and GG, respectively, in accordance with some embodiments of the present disclosure.

The electronic circuit may be formed of one or more basic logic devices, such as a NAND gate device, an inverter gate, an XOR gate, an AND gate, a NOR gate, an And-Or-Inverter (AOI) gate, a flip-flop, a shift register, or other suitable logic gate devices. In the depicted example, the electronic circuit of the semiconductor device 20 includes cells 21 and 22, where the cell 21 is configured to implement a NAND gate while the cell 22 is configured to implement an inverter gate.

Referring to the design layout 20, each of the cells 21 and 22 includes an N-type FET (N-FET) associated with a first active region 202 and a P-type FET (P-FET) associated with a second active region 204 in a substrate layer extending in a horizontal direction, e.g., X-axis. The first active region 202 has a conductivity type, e.g., N-type, different from the conductivity type, e.g., P-type, of the second active region 204. The cells 21 and 22 further include gate structures (GT) 206A, 206B, 206C, respectively in the gate layer 130. The gate structures 206A through 206C are configured as functional gate structures (GT-F) and extend in a vertical direction, e.g., Y-axis. As illustrated in FIG. 2A, the cell 21 has a right cell side abutting a left cell side of the cell 22, where the cell boundary between the cells 21 and 22 is defined by a gate structure (GT) 208B. The gate structure 208B, which is also referred to as a cell-edge gate structure, is configured as a non-functional (GT-NF) or dummy gate structure.

Referring to FIGS. 2A, 2B, 3A, 3B, 3C and 3E, in some embodiments, the functional gate structures 206A, 206B and 206C each include a gate dielectric layer 302A, 302B, 302C wrapping around the active region 202, the gate electrodes 303A, 303B, 303C wrapping around the active region 202 and the gate dielectric layer 302A through 302C for providing switching functions of the respective FETs, and a capping layer 308A, 308B, 308C over the respective gate electrode 303A, 303B, 303C. The materials of the gate dielectric layers 302 and the gate electrode 303 are similar to those of the semiconductor device 10 discussed with reference to FIG. 1A. The capping layers 308A through 308C may be formed of a dielectric material, such as oxide, nitride, carbide, oxynitride, or other suitable materials.

Figure 3B:
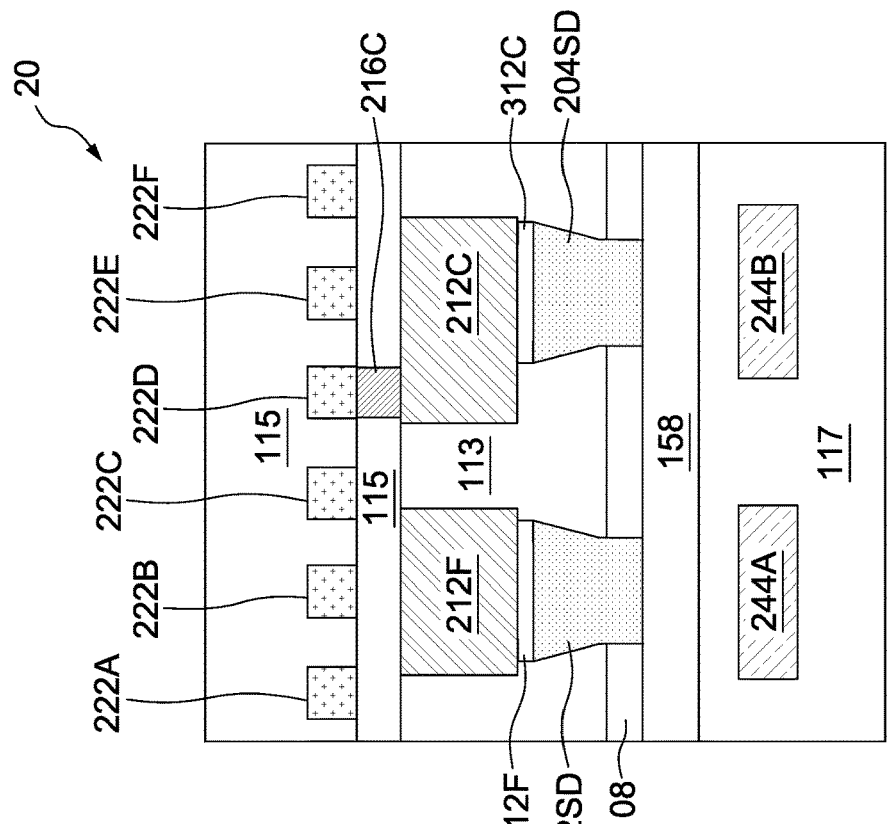
FIGS. 3A, 3B, 3C, 3D, 3E, 3F and 3G show cross-sectional views of the design layout associated with the electronic circuit shown in FIGS. 2A and 2B, in accordance with some embodiments of the present disclosure.
Figure 3A:
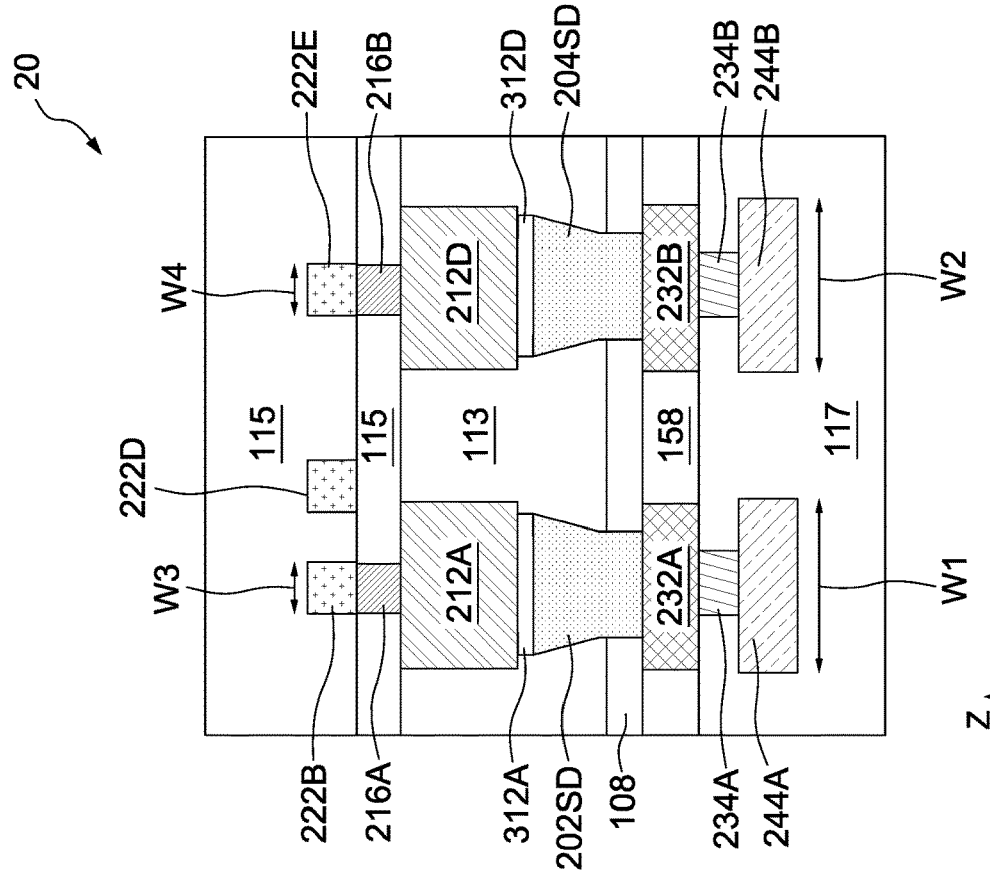
Figure 3D:
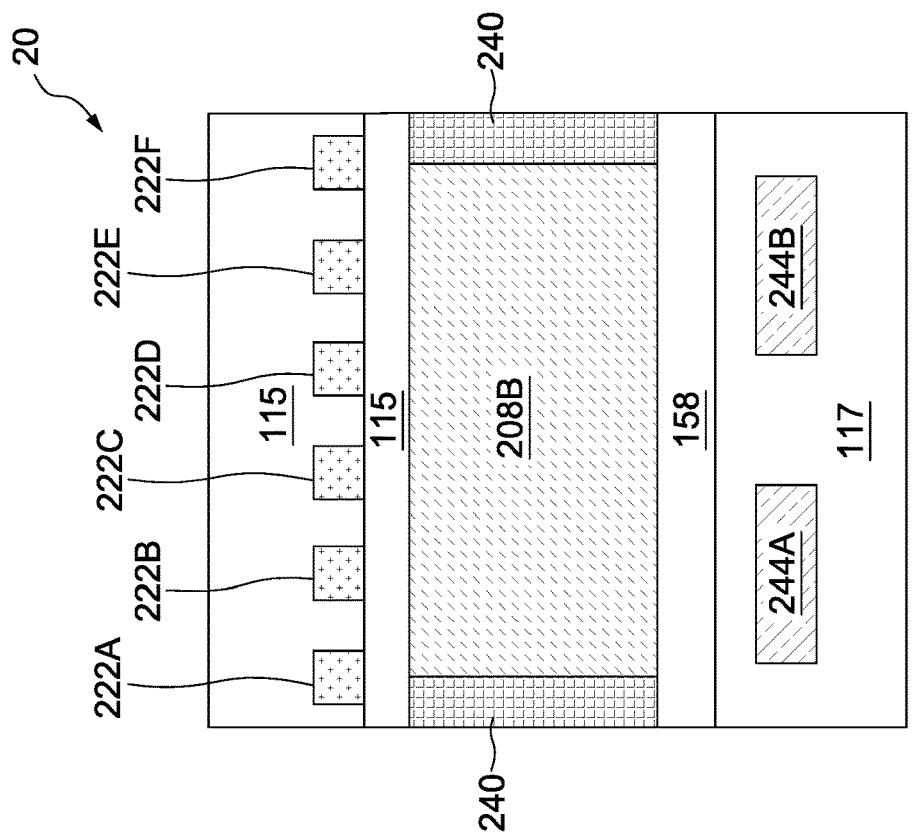
Figure 3C:
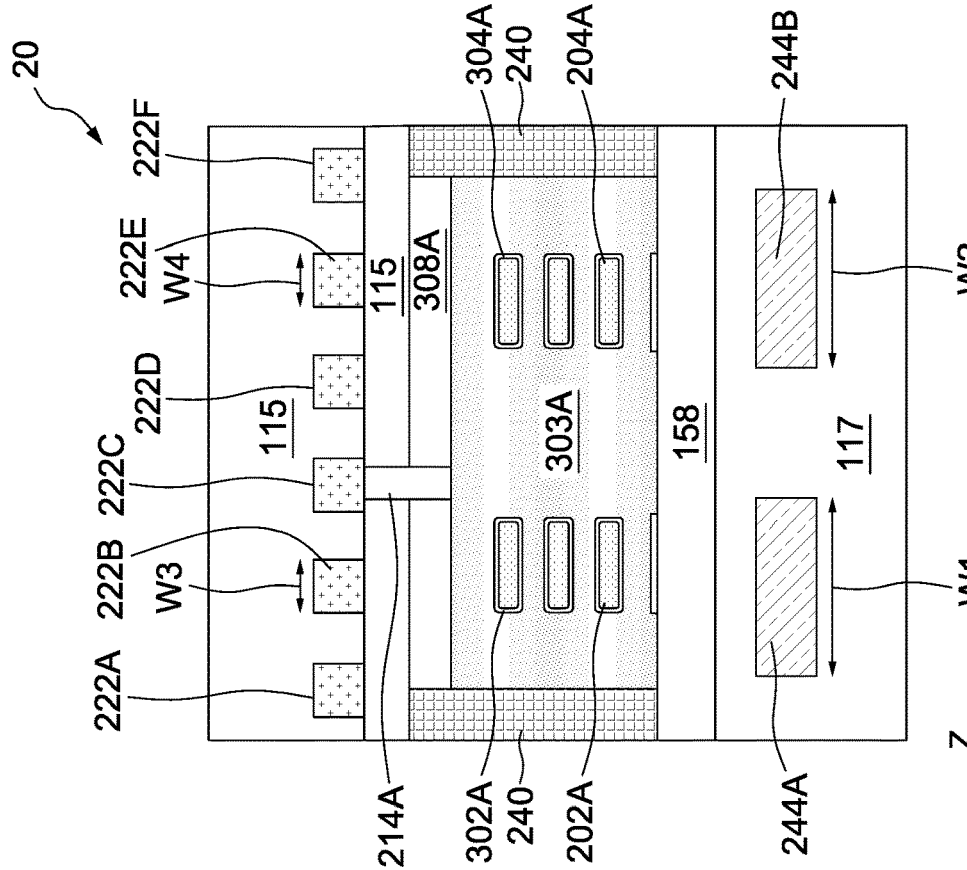
Figure 3E:
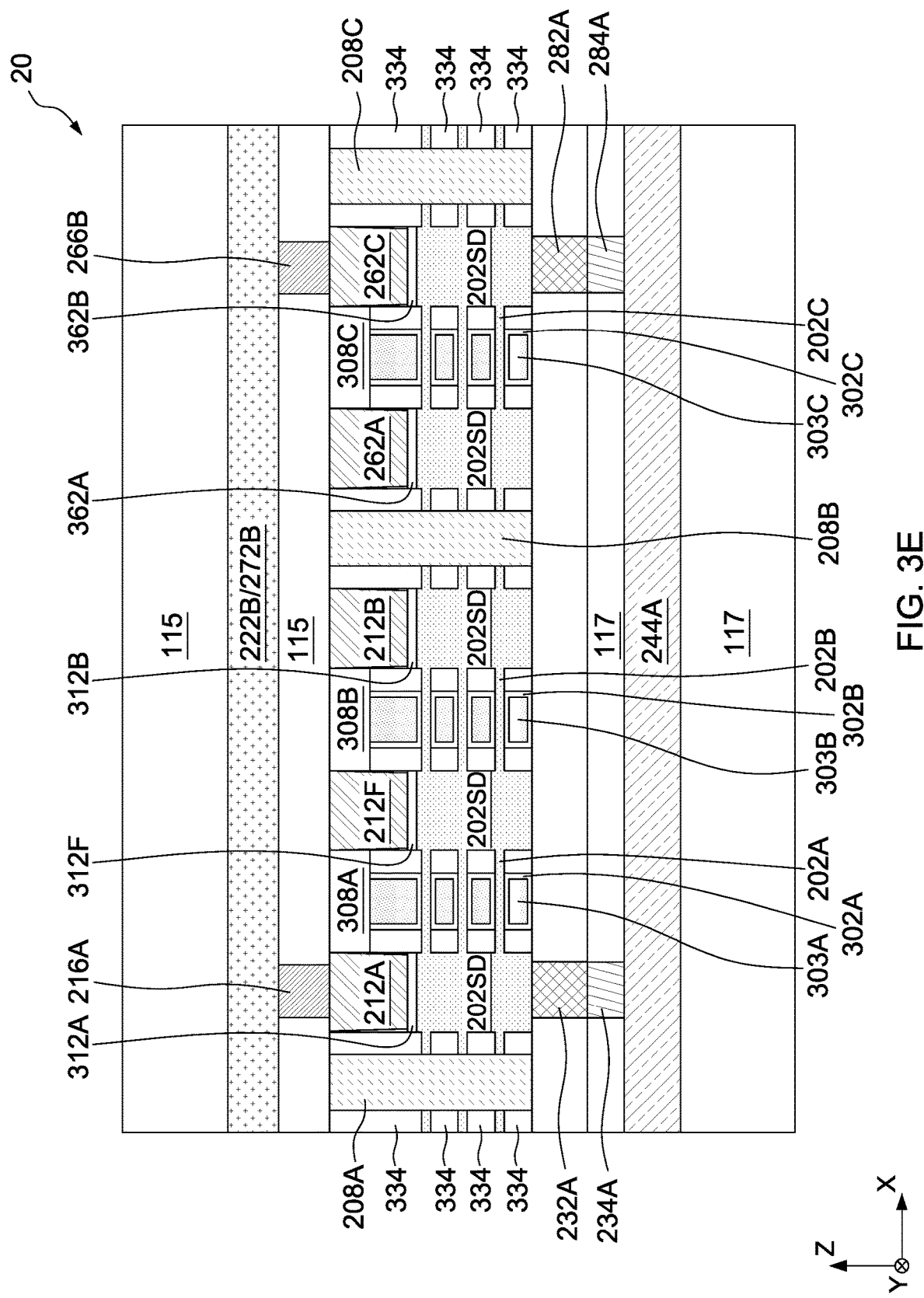

In addition, referring to FIGS. 3C and 3E, the gate structure 206A straddles the active region 202, in which the portion of the active region 202 overlapped with the gate structure 206A is defined as channels 202A of the respective P-FET or N-FET. In the depicted example, the active region 202 includes multiple nanosheets extending in the X-axis. As a result, portions of the active region 202 overlapped with the gate structure 206A form multiple channel regions 202A, portions of the active region 202 overlapped with the gate structure 206B form multiple channel regions 202B, and portions of the active region 202 overlapped with the gate structure 206C form multiple channel regions 202C. Furthermore, portions of the active region 202 non-overlapped with the gate structures 206 form source/drain regions 202SD. Two adjacent source/drain regions 202SD on two sides of the respective gate structure 206 may form a FET, in which the gate structure 206 and the two source/drain regions serve as a gate terminal, a source terminal and a drain terminal, respectively, of the FET.

In some embodiments, the source/drain regions 202SD may be formed by etching the original silicon materials on two sides of the channel region, followed by growing epitaxial regions with suitable dopants. In some embodiments, the epitaxially grown source/drain regions 202SD are formed on two sides of the gate structures 206 and cover two sides of the channel regions exposed from the gate structure 206. The source/drain region 202SD have an upper surface higher than the channel regions.

Similarly, referring to FIGS. 2A, 2B, 3A, 3B, 3C and 3F, in some embodiments, the functional gate structures 206A, 206B and 206C each include a gate dielectric layer 304A, 304B, 304C wrapping around the active region 204, the gate electrodes 303A, 303B, 303C wrapping around the gate dielectric layer 304A through 304C, and the capping layers 308A through 308C. The gate structure 206A straddles the active region 204, in which the portion of the active region 204 overlapped with the gate structure 206A is defined as channels 304A of the respective P-FET or N-FET. Portions of the active region 204 overlapped with the gate structure 206A form multiple channel regions 204A, portions of the active region 204 overlapped with the gate structure 206B form multiple channel regions 204B, and portions of the active region 204 overlapped with the gate structure 206C form multiple channel regions 204C. Furthermore, portions of the active region 202 non-overlapped with the gate structures 206 form source/drain regions 204SD. Two adjacent source/drain regions 204SD on two sides of the respective gate structure 206 may form a FET, in which the gate structure 206 and the two source/drain regions serve as a gate terminal, a source terminal and a drain terminal, respectively, of the FET.

Figure 3F:
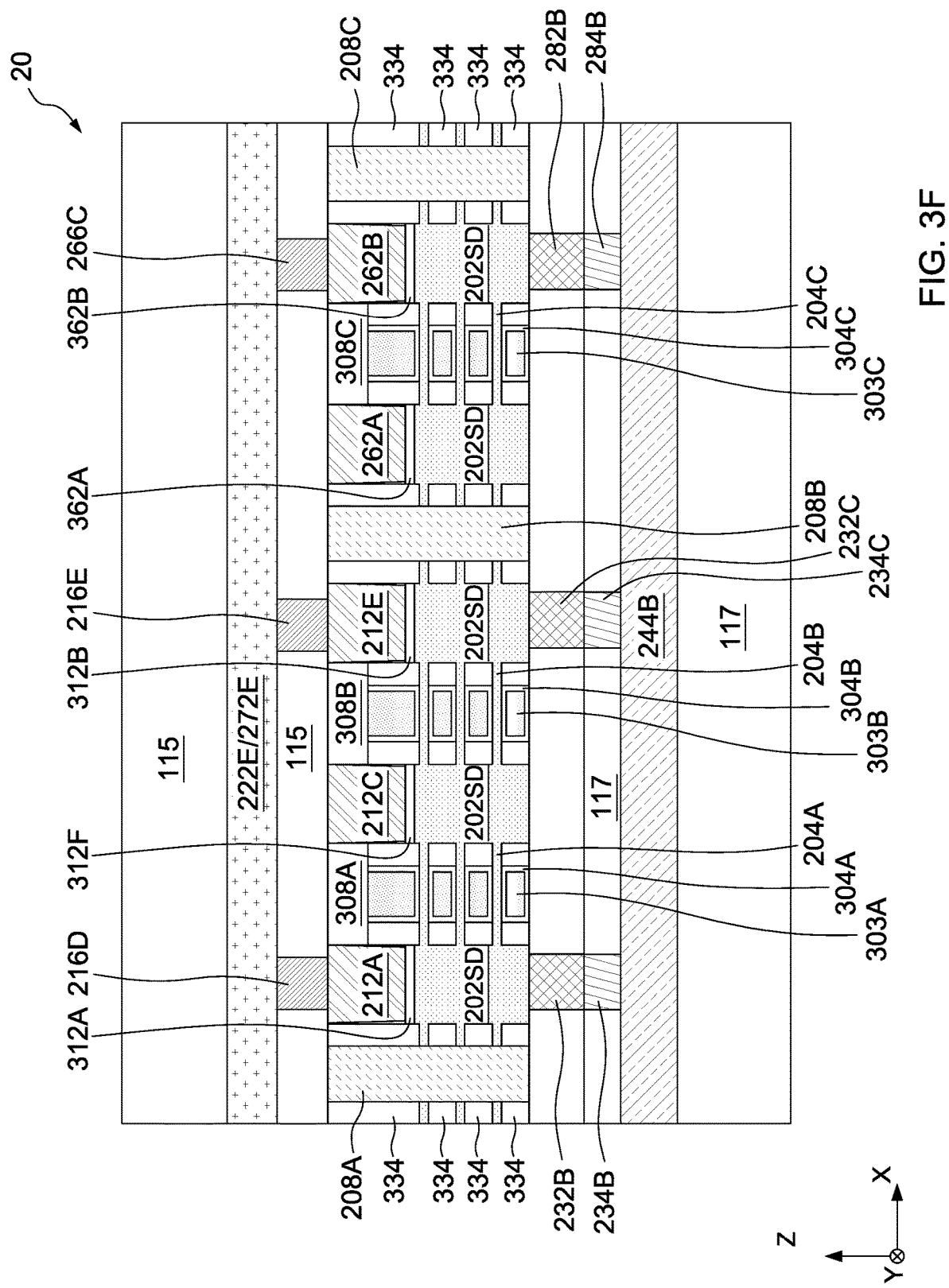

In some embodiments, referring to FIGS. 3E and 3F, the active region 202 or 204 extend through the functional gate structures 206 (e.g., 206A, 206B, 206C) in the X-axis and is obstructed by the non-functional gate structures 208 (including 208A, 208C and 208C). As a result, the active region 202 or 204 is non-contiguous at the gate structures 208A, 208C and 208C. In the present disclosure, the gate structures 208 are implemented by a dummy gate structure, e.g., a continuous poly on diffusion edge (CPODE) gate structure. The CPODE gate structure is formed of an electrically insulating material or a dielectric material, e.g., silicon oxide, silicon nitride, silicon carbide, silicon oxynitride, polymers, or the like. Therefore, no channel is formed in the gate structures 208 at the cell boundaries of the cells 21 and 22 since the areas originally occupied by the active region 202 and 204 are replaced with a dielectric material of the CPODE.

Referring to FIGS. 3A and 3B, in some embodiments, the semiconductor device 20 includes isolation structures (STI) 108 around the bottom of the active region 202 or 204, in which the active region 202, 204 have a fin shape for FinFET. In some embodiments, the isolation structure 108 laterally surrounds the bottom portions of the active region 202 or 204. In some embodiments, the design layout 20 includes ILD layers 113 electrically insulating the active regions 202, 204, the gate structures 206, 208, and the front-side gate-layer conductive lines 212. In some embodiments, the isolation structure 108 laterally surrounds the bottom portions of the active region 202 or 204.

Referring to FIGS. 3E and 3F, in some embodiments, the design layout 20 includes spacer layers 334 on the outer sidewalls of the gate structures 206 and 208. The spacer layers 334 may be formed to fill the spaces between the gate structures 206, 208 and the source/drain regions 202SD, 204SD. The spacer layers 334 may be formed of dielectric layers, such as nitride, oxide, carbide, oxynitride, a combination thereof or the like. The spacer layers 334 may include a multilayer structure.

In some embodiments, the cell 21 further includes front-side gate-layer conductive lines (F-CT) 212A, 212B, 212C, 212D, 212E and 212F arranged in the gate layer 130 and electrically connected to the front sides of the corresponding source/drain regions 202SD or 204SD. In some embodiments, the cell 22 further includes front-side gate-layer conductive lines (F-CT) 262A, 262B and 262C arranged in the gate layer 130 and electrically connected to the front sides of the corresponding source/drain regions 202SD or 204SD. In some embodiments, the cell 21 also includes silicide layers 312A, 312B, 312C, 312D, 312E and 312F electrically connecting the corresponding the front-side gate-layer conductive line 212A, 212B, 212C, 212D, 212E and 212F to the corresponding source/drain regions 202SD or 204SD. The silicide layer 312 may include $NiSi_2$, $WSi_2$, $TaSi_2$ $CrSi_2$, or the like, to reduce contact resistance at the boundary between the source/drain region 202SD or 204SD and front-side gate-layer conductive lines 212. Likewise, the cell 22 also includes silicide layers 362A, 362B and 362C electrically connecting the corresponding the front-side gate-layer conductive line 262A, 262B, 262C to the front sides of the corresponding source/drain regions 202SD or 204SD. In some embodiments, the front-side gate-layer conductive lines 212 or 262 have upper surfaces coplanar with the upper surface s of the capping layers 308 or the upper surfaces of the non-functional gate structures 208.

Referring to FIGS. 2A, 3A and 3B, 3E and 3F, the cell 21 may also include front-side conductive vias (F-VD0) 216A, 216B, 216C, 216D, 216E arranged in a first front-side conductive via layer 110V-0 of the front-side interconnect structure 110 of the semiconductor device 20, and electrically connected to the front sides of the source/drain regions 202SD or 204SD through the corresponding front-side gate-layer conductive lines 212A through 212E. Likewise, referring to FIGS. 2A, 3E, 3F and 3G, the cell 22 may also include front-side conductive via 256A, 256B, 256C arranged in the first front-side conductive via layer 110V-0 and electrically connected to the front sides of the source/drain regions 202SD or 204SD through the corresponding front-side conductive lines 262A through 262C.

Figure 3G:
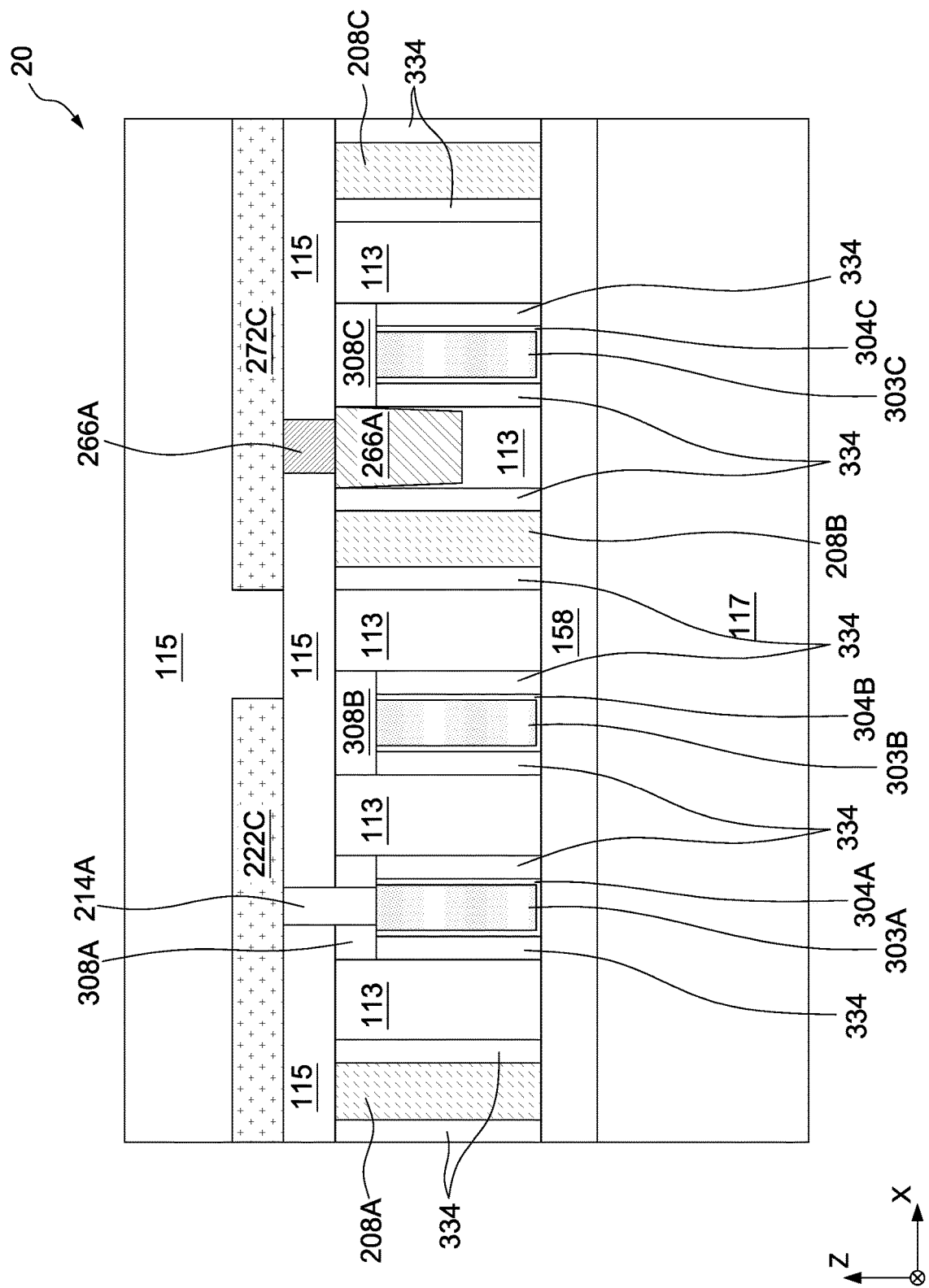

Referring to FIGS. 2A, 3C and 3G, the cell 21 may include front-side gate vias (F-VG) 214A and 214B arranged in the first front-side conductive via layer 110V-0 and electrically connected to the front sides of the gate electrodes 303A and 303B, respectively. In some embodiments, the cell 21 further includes front-side conductive lines 222C and 222F extending in the X-axis and electrically connected to the front sides of the gate electrodes 303A and 303B through the front-side gate vias 214A and 214B, respectively, to bias the gate electrodes 303A and 303B with biasing voltages. Likewise, the cell 22 may include a front-side gate via 214C arranged in the first front-side conductive via layer 110V-0 and electrically connected to the front side of the gate electrode 303C. In some embodiments, the cell 22 further includes a front-side conductive lines 272D extending in the X-axis and electrically connected to the front side of the gate electrode 303C through the front-side gate via 214C to bias the functional gate structure 206C with a biasing voltage.

In some embodiments, the semiconductor device 20 includes front-side conductive lines (F-M1) 222A, 222B, 222D and 222E extending in the X-axis in a first conductive line layer F-M1 of the front-side interconnect structure 110 of the semiconductor device 20 and electrically connected to the corresponding underlying front-side gate-layer conductive lines 212B, 212A, 212C, 212D and 212E through the front-side conductive vias 216B, 216A, 216C, 216D and 216E, respectively. Likewise, In some embodiments, the design layout of the semiconductor device 20 includes front-side conductive lines 272B, 272C, and 272E extending in the X-axis in the first conductive line layer F-M1 and electrically connected to the corresponding underlying front-side gate-layer conductive lines 262B, 262A, 262C through the front-side conductive vias 266B, 266A, 266C, respectively. In some embodiments, the front-side conductive lines 222B and 272B are physically connected, and the front-side conductive lines 222E and 272E are physically connected. At least one of the front-side conductive lines 222 is configured as a power rail and configured to receive a first supply voltage (VDD) or a second supply voltage (VSS). In some embodiments, the first supply voltage is a positive voltage (VDD) and the second supply voltage is ground (VSS), or vice versa.

Referring to FIGS. 1A, 2B and 3A through 3G, the semiconductor device 20 includes a backside contact layer 140 in the backside interconnect structure 120 below the substrate layer 100. In some embodiments, the backside contact layer 140 is in physical contact with the isolation layer 108 and the active region 202 or 204 of the substrate layer 100. The backside contact layer 140 includes backside conductive lines (B-CT) 232A, 232B and 232C extending in the Y-axis and electrically connected to backsides of the source/drain regions 202SD and 204SD, respectively. In some embodiments, the backside contact layer 140 further includes backside conductive lines (B-CT) 282A, 282B extending in the Y-axis and electrically connected to the backsides of the source/drain regions 202SD and 204SD, respectively.

In some embodiments, the semiconductor device 20 includes backside conductive lines (B-M1) 244A, 244B extending in the X-axis in the first backside conductive line layer 120M-1 of the backside interconnect structure 120 of the semiconductor device 20 and electrically connected to the corresponding overlying backside conductive lines 232A, 232B, 232C through backside conductive vias 234A, 234B, 234C, respectively. Likewise, in some embodiments, the backside conductive lines 244A, 244B are further electrically connected to the corresponding overlying backside conductive lines 282A, 282B through the backside conductive vias 284A, and 284B, respectively. The backside conductive line layer 120M-1 may include only the backside conductive lines 244A and 244B, in which the backside conductive lines 244A and 244B are configured as power rails and receive the first supply voltage and the second supply voltage, respectively.

In some embodiments, the backside contact layer 140 or the backside conductive lines 232, 282 are omitted from the backside of the substrate layer, and the backside conductive vias 234, 284 are formed to be directly connected to the backsides of the source/drain regions 202SD and 204SD.

In some embodiments, the backside interconnect structure 120 of the semiconductor device 20 is used for constructing the power mesh, and thus only two backside conductive lines 244A and 244B, serving as the power rails, may be sufficient for providing the first supply voltage and the second supply voltage. As such, the backside conductive lines 244 can have a width W2 measured in the Y-axis greater than the width W1, measured in the Y-axis, of the front-side conductive lines 222. In some embodiments, a width ratio of the backside conductive line 244 to the front-side conductive line is between about 2 and about 10. Referring to FIGS. 3A and 3B, the backside conductive lines or backside power rails 244 overlaps the backside conductive lines 232, and overlaps at least one front-side conductive line or front-side power rail 222.

Referring to FIGS. 3A through 3G, in some embodiments, the semiconductor device 20 includes IMD layers 115 electrically insulating the front-side conductive vias 214, 216, and the front-side conductive lines 222, 272. In some embodiments, the semiconductor device 20 includes an ILD layer 158 electrically insulating the backside conductive lines 232. In some embodiments, the semiconductor device 20 includes IMD layers 117 electrically insulating the backside conductive vias 234 and the back-side conductive lines 244.

In some embodiments, the semiconductor device 20 further includes multiple gate partition structures (CUT-G) 240 at the upper cell sides or lower cell sides of the cells 21 and 22. The gate partition structure 240 may be used to partition the contiguous gate structures 206 or 208 into gate structure segments, in which the gate structures 206 or 208 formed from the same gate structure strips but arranged in different cells can be separated from each other. In some embodiments, the gate partition structure 240 includes a dielectric material, such as oxide, nitride, carbide, oxynitride, combinations thereof, or other suitable materials.

Based on the foregoing, the semiconductor 20 provides the power mesh from either the front-side interconnect structure 110 or the backside interconnect structure 120, or both. In some embodiments, the first supply voltage (VDD) is provided to a P-type source/drain region, e.g., 204SD, either through an upper conduction path running through the front-side conductive lines 222, the front-side conductive vias 216 and the front-side gate-layer conductive lines 212 to reach the front sides of the P-type source/drain regions 204SD, or through a lower conduction path running through the backside conductive lines 244, the backside conductive vias 234 and the backside conductive lines 232 to reach the backsides of the P-type source/drain regions 204SD. In some embodiments, the second supply voltage (VSS) is provided to an N-type source/drain region, e.g., 202SD, either through an upper conduction path running through the front-side conductive lines 222, the front-side conductive vias 216 and the front-side gate-layer conductive lines 212 to reach the front sides of the N-type source/drain regions 202SD, or through a lower conduction path running through the backside conductive lines 244, the backside conductive vias 234 and the backside conductive lines 232 to reach the backsides of the N-type source/drain regions 204SD. The power mesh constructed by the upper and lower conduction paths can increase the transmission power, and lower the resistance or capacitance to thereby reduce the transmission delay.

Figure 4A:
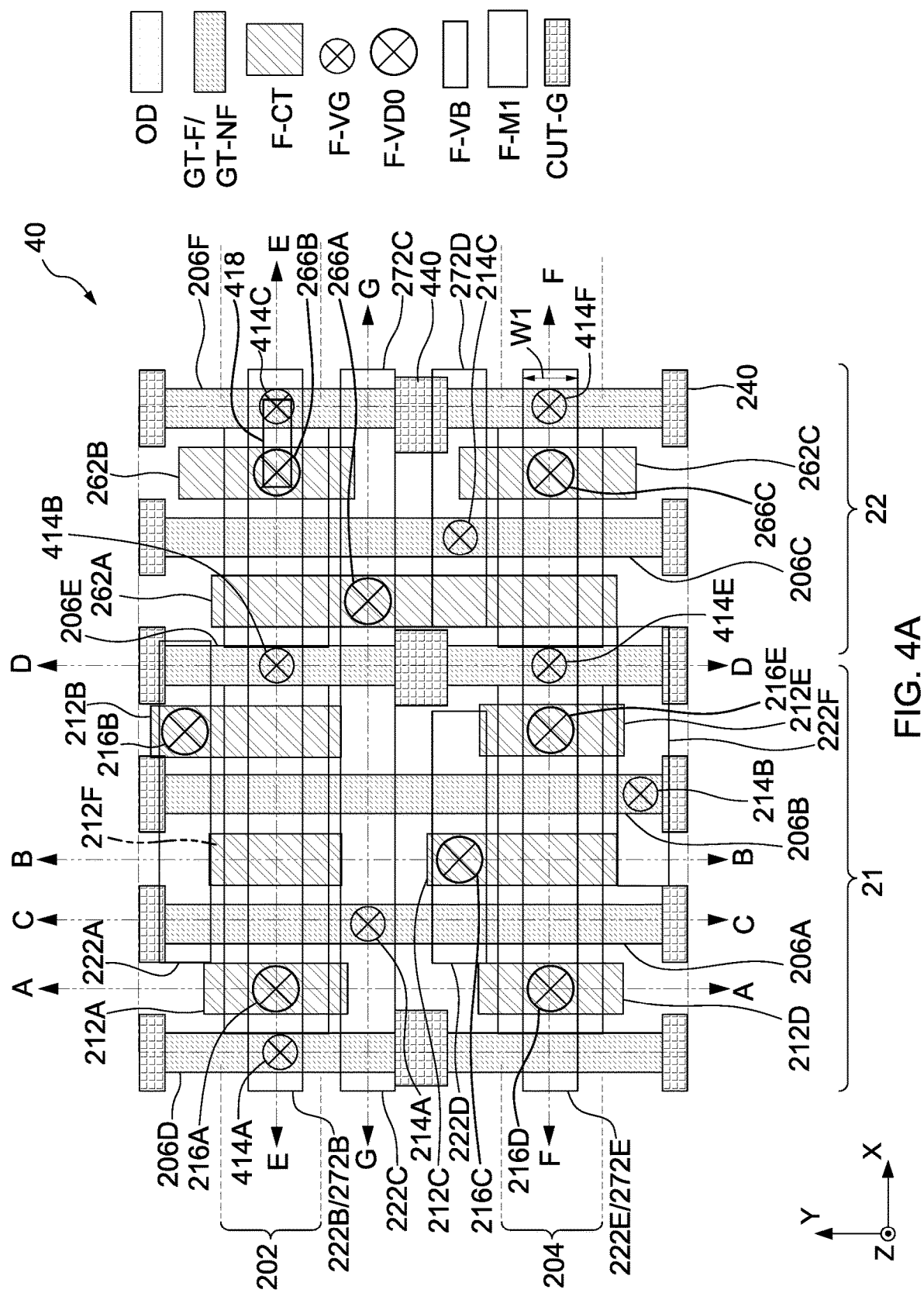
FIGS. 4A and 4B show a top view and a bottom view, respectively, of a design layout associated with an electronic circuit, in accordance with some embodiments of the present disclosure.
Figure 4B:
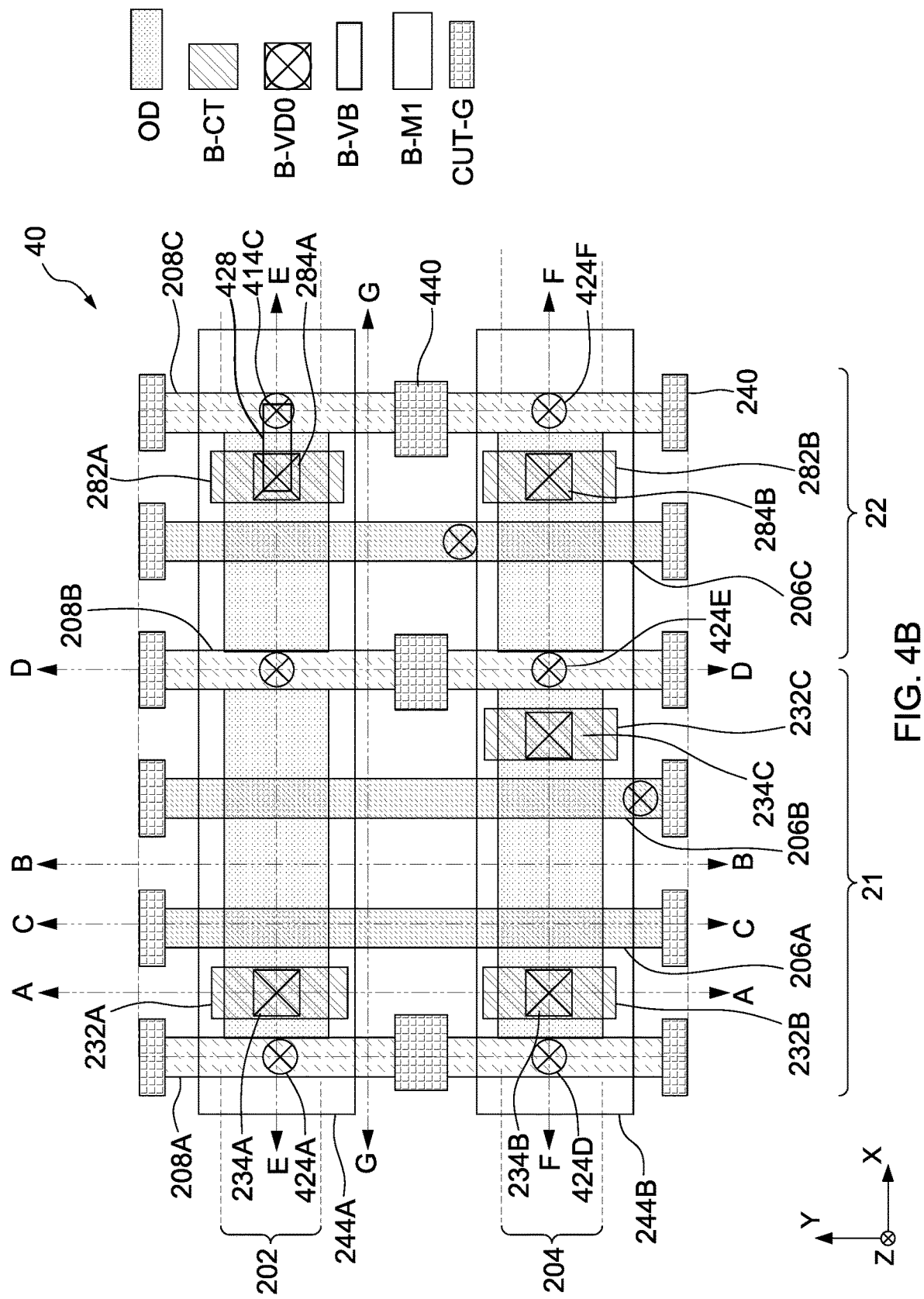
Figure 5B:
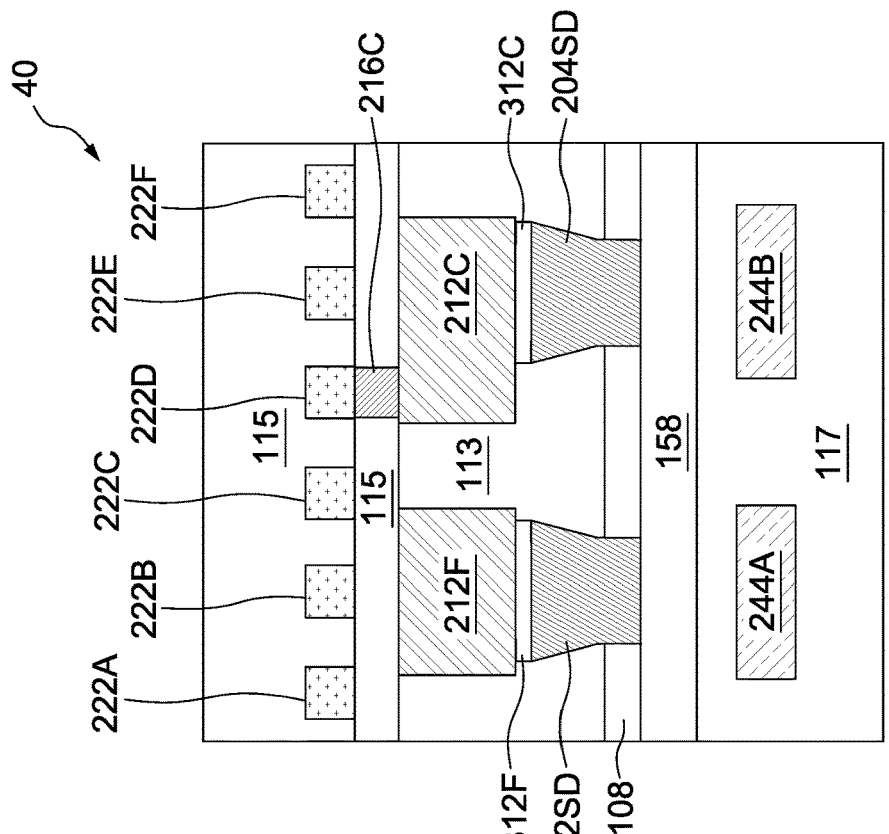
FIGS. 5A, 5B, 5C, 5D, 5E, 5F and 5G show cross-sectional views of the design layout associated with the electronic circuit shown in FIGS. 4A and 4B, in accordance with some embodiments of the present disclosure.
Figure 5A:
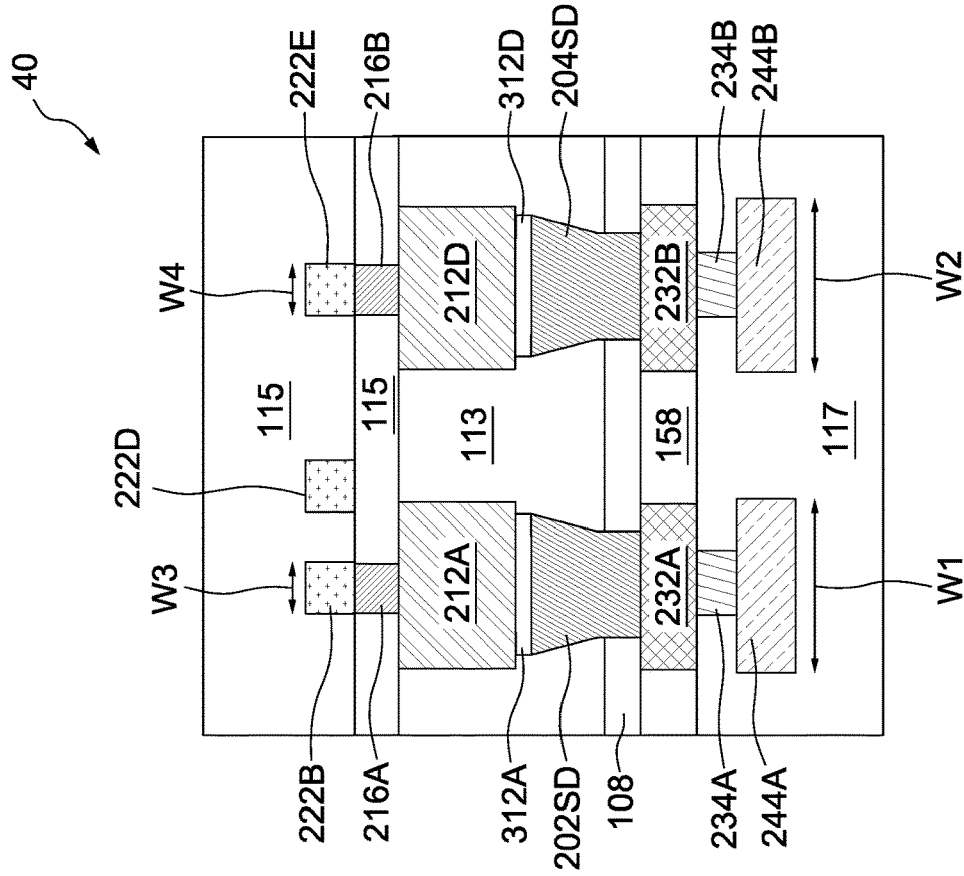
Figure 5D:
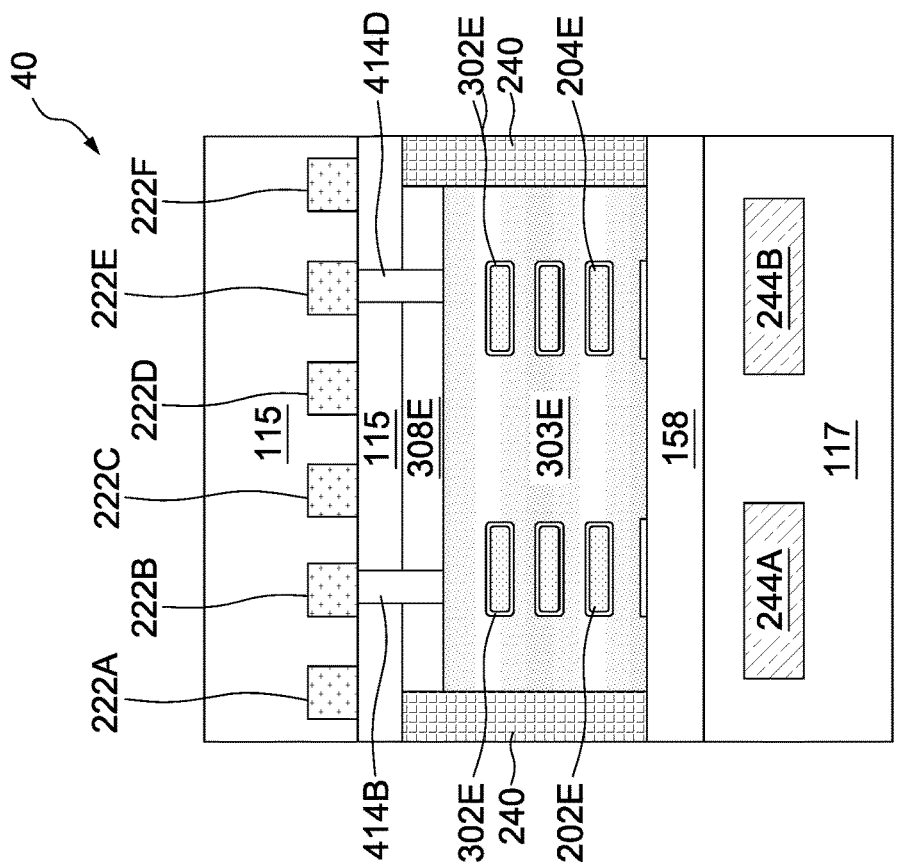
Figure 5C:
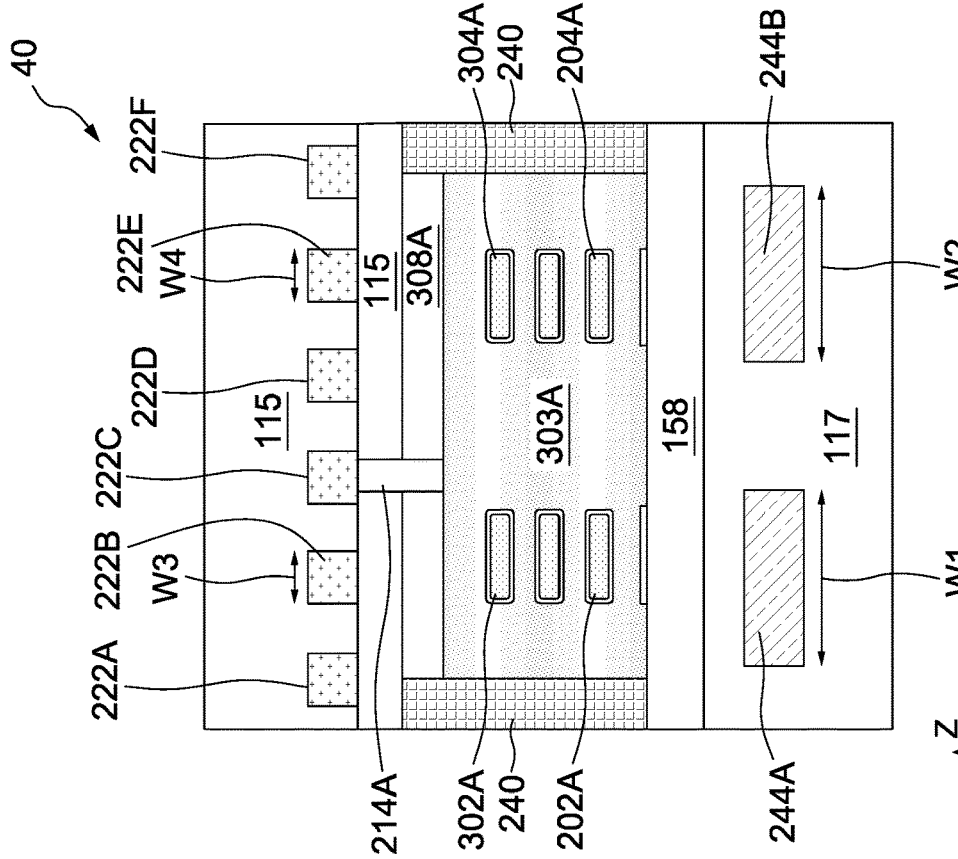
Figure 5E:
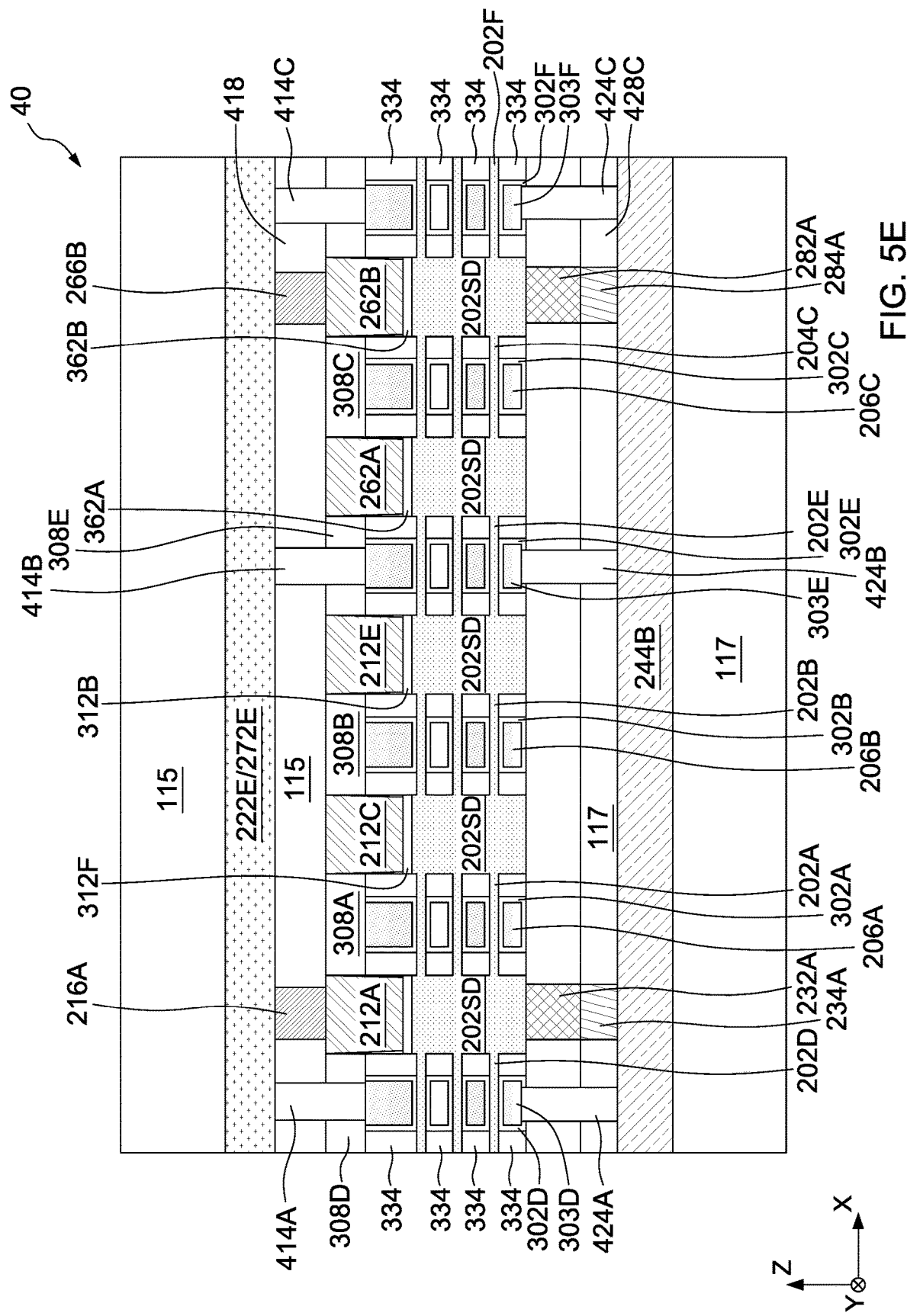
Figure 5F:
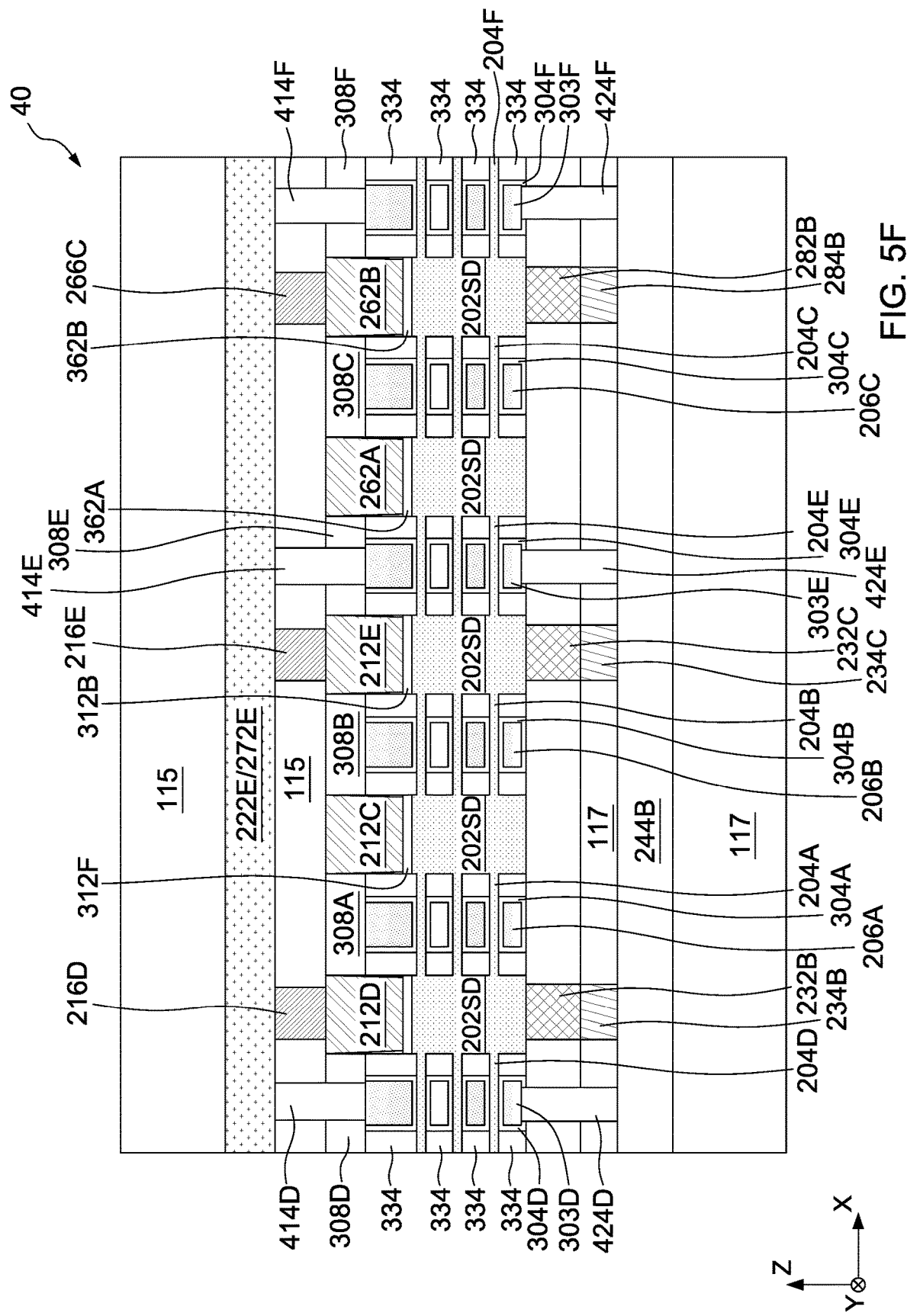
Figure 5G:
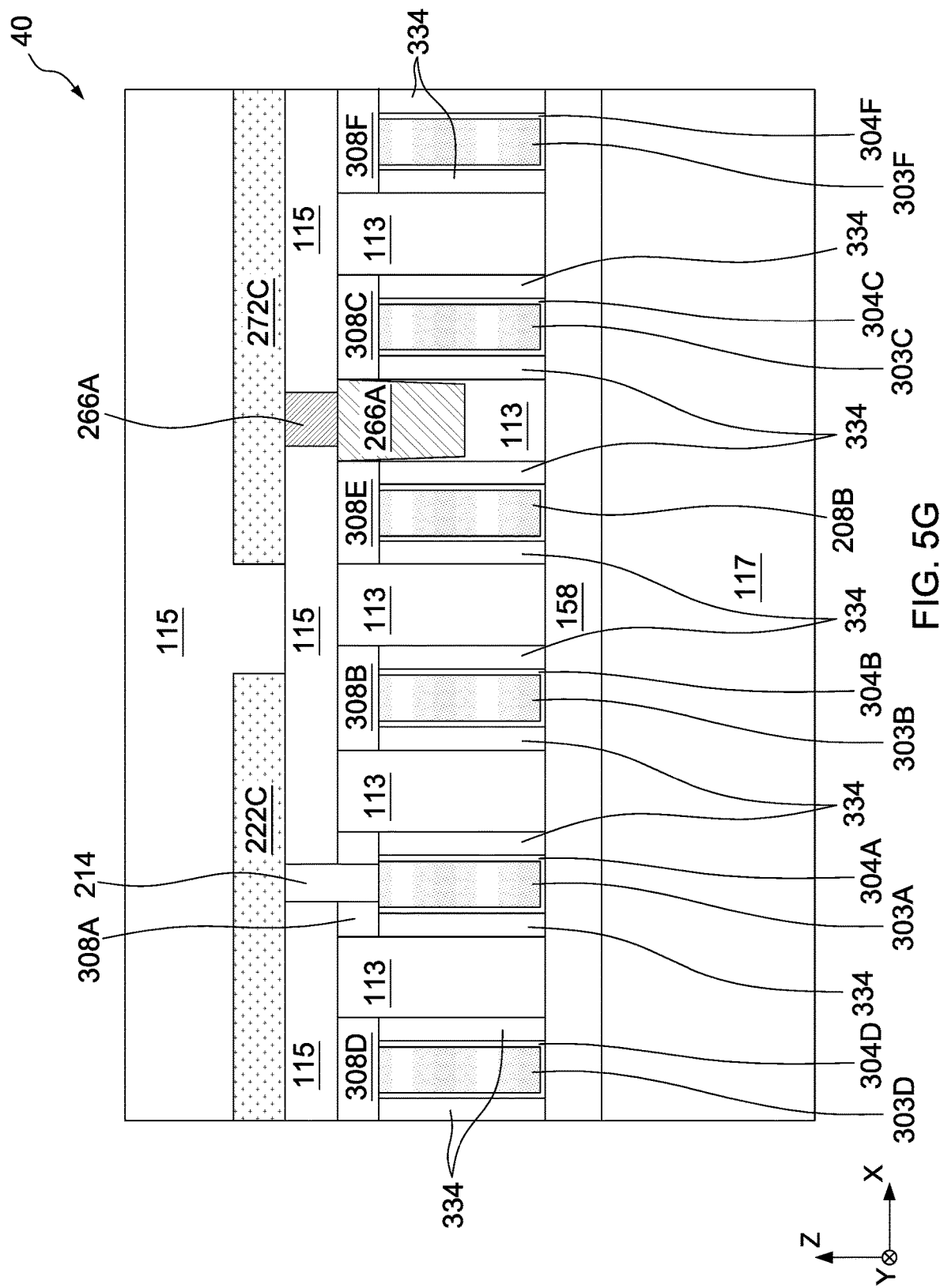

FIGS. 4A and 4B show a top view and a bottom view, respectively, of a design layout of a semiconductor device 40 associated with an electronic circuit, in accordance with some embodiments of the present disclosure. FIGS. 5A, 5B, 5C, 5D, 5E, 5F and 5G show cross-sectional views of the semiconductor device 40 associated with the electronic circuit shown in FIGS. 4A and 4B along section lines AA, BB, CC, DD, EE, FF and GG, respectively, in accordance with some embodiments of the present disclosure.

In some embodiments, the electronic circuit implemented by the semiconductor device 40 is similar to that implemented by the design layout 20, i.e., the electronic circuit shown in FIGS. 4A and 4B includes the cells 21 and 22. However, the cell 21 or 22 includes non-functional gate structures (GT-NF) 206D, 206E or 206F in place of the non-functional gate structures 208A, 208B and 208C in the cell 21 or 22 as shown in FIGS. 2A and 2B. The non-functional gate structures 206D through 206F have the material and layer configurations similar to those of the functional gate structures 206A through 206C, but the design layout 40 includes additional gate partition layers 440 to divide the non-functional gate structures 206D through 206F into upper gate structures and lower gate structures. Each upper/lower portion of the non-functional gate structures 206D through 206F is electrically tied-off by being electrically coupled to the first supply voltage or the second supply voltage, dependent upon the dopant type of the source/drain region 202SD or 204SD immediately adjacent to the gate structure 206D through 206F. For example, the active region 202 is an N-type active region while the active region 204 is a P-type active region. Accordingly, the upper portions of the non-functional gate structures 206D through 206F are biased by the second supply voltage, e.g., VSS, while the lower halves of the non-functional gate structures 206D through 206F are biased by the first supply voltage, e.g., VDD.

Based on the above, in some embodiments, the design layout 40 includes front-side gate via 414A, 414B, 414C electrically connected to the front sides of the upper halves of the gate structure 206D, 206E, 206F, respectively. The front-side gate vias 414A through 414C are electrically connected to the front-side conductive line 222B or 272B such that the upper halves of the gate structures 206D, 206E, 206F are tied off by receiving the second supply voltage. Similarly, in some embodiments, the design layout 40 includes front-side gate vias 414D, 414E, 414F electrically connected to the front sides of the lower halves of the gate structure 206D, 206E and 206F, respectively. The front-side gate vias 414D through 414F are electrically connected to the front-side conductive line 222E or 272E such that the lower halves of the gate structures 206D, 206E, 206F are tied off by receiving the first supply voltage.

In some embodiments, the design layout 40 includes backside gate via 424A, 424B, 424C electrically connected to the backsides of the upper halves of the gate structure 206D, 206E, 206F, respectively. The backside gate vias 424A through 424C are electrically connected to the backside conductive line 244A such that the upper halves of the gate structures 206D, 206E, 206F are tied off by receiving the second supply voltage. Similarly, in some embodiments, the design layout 40 includes front-side gate vias 424D, 424E, 424F electrically connected to the backsides of the lower halves of the gate structure 206D, 206E and 206F, respectively. The backside gate vias 424D through 424F are electrically connected to the backside conductive line 244B such that the lower halves of the gate structures 206D, 206E, 206F are tied off by receiving the first supply voltage.

In some embodiments, the tie-off gate vias 414 are electrically coupled to their adjacent conductive vias 216, 266 to simplify the design of closely-spaced conductive vias. Referring to FIGS. 4A, 4B, 4E and 4F, the semiconductor device 60 includes a front-side conductive line 418 extending horizontally in the front-side conductive via layer F-VD0 to electrically connect the adjacent gate via 414C and drain via 266B. In some embodiments, the adjoined conductive vias/lines 414C/266B/418 form a conductive butt line with a rotated L-shape. Likewise, the semiconductor device 60 includes a backside conductive line 428 extending horizontally in the backside conductive via layer B-VD0 to electrically connect the adjacent gate via 424C and drain via 284A. In some embodiments, the adjoined conductive vias/lines 424C/284A/428 form a conductive butt line with a rotated L-shape.

Figure 6A:
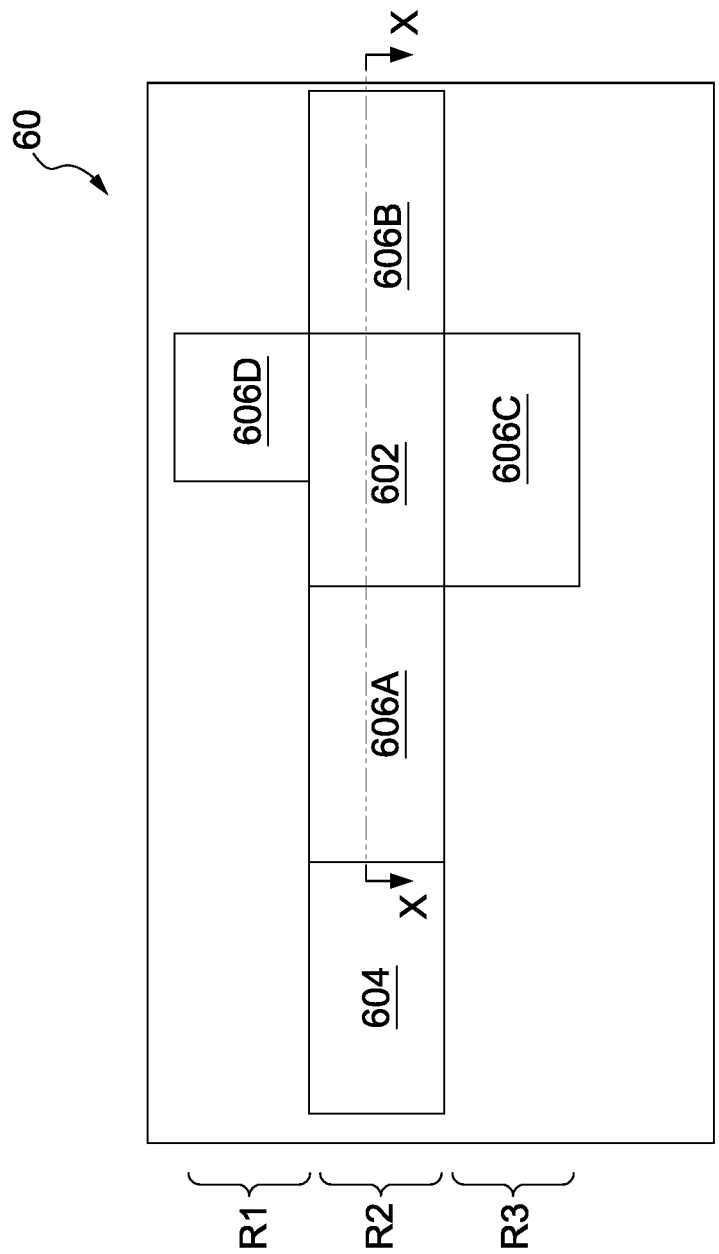
FIGS. 6A and 6B show a top view and a cross-sectional view, respectively, of a design layout associated with an electronic circuit, in accordance with some embodiments of the present disclosure.
Figure 6B:
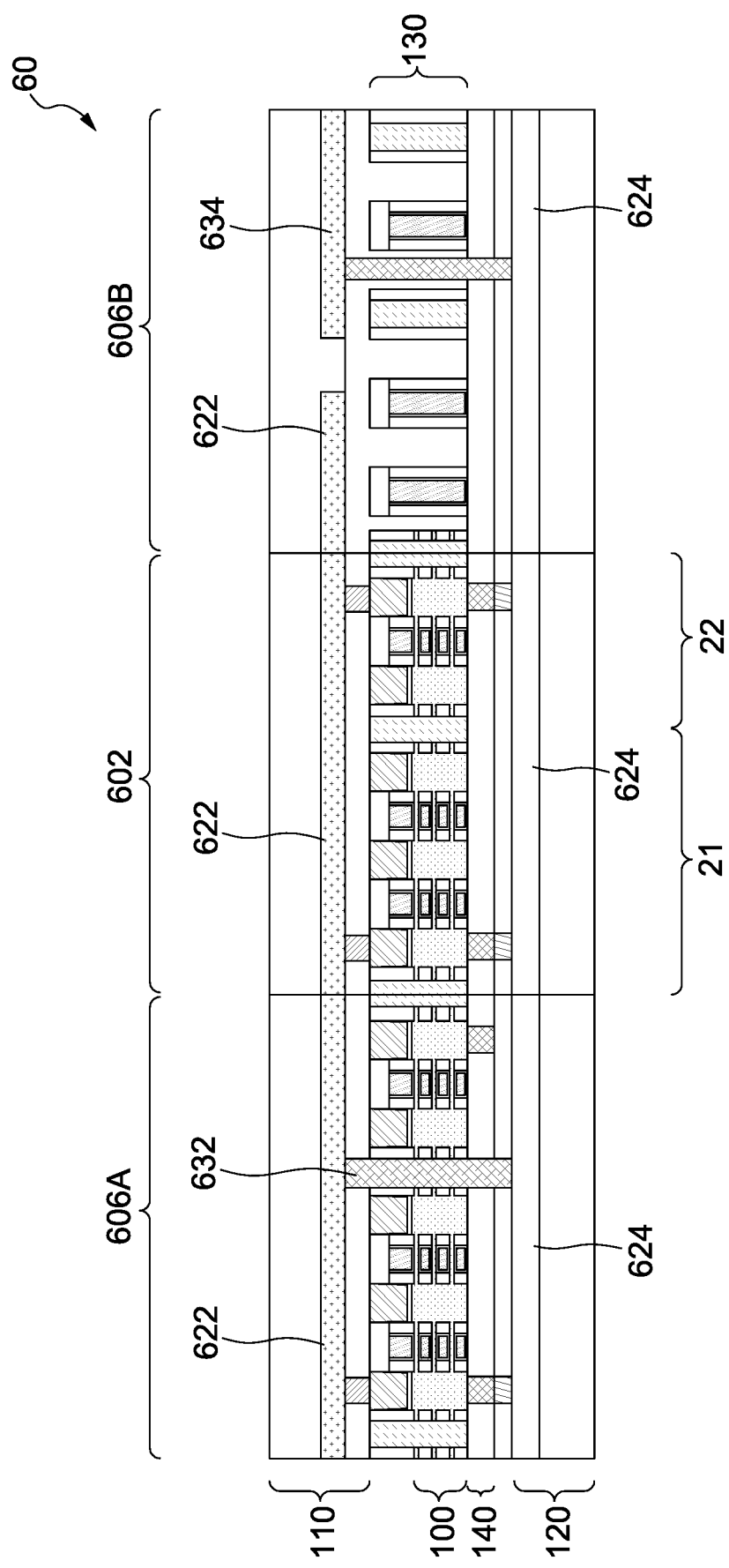

FIGS. 6A and 6B show a top view and a cross-sectional view, respectively, of a design layout of a semiconductor device 60 associated with an electronic circuit, in accordance with some embodiments of the present disclosure. The cross-sectional view of FIG. 6B is taken along the sectional lines XX of FIG. 6A. The design layout includes rows R1, R2 and R3 extending in the X-axis. The design layout includes cells 602 and 604 placed in the row R2 by a placing and routing operation. In some embodiments, the cell 602 or 604 are designed to implement a semiconductor device, including one or more of a NAND gate device, an inverter gate, an XOR gate, an AND gate, a NOR gate, an AOI gate, a flip-flop, or other suitable logic gate devices. In some embodiments, the transistors in semiconductor device in the cell 602 or 604 include a FinFET, a GAA FET, e.g., a nano sheet FET or a nanowire FET.

The design layout may further includes one or more tap cells 606, e.g., 606A, 606B, 606C, 606D, placed in one or more of the rows R1, R2, R3. The tap cells 606 may be placed in a placing and routing operation, in which the adjacent cells 602, 604 may be abutted together. In some embodiments, some of the tap cells 606 are omitted from the design layout 60. In some embodiments, the cells 602 and 604 abut to each other and the tap cells 606 are formed on the outer sides of the cells 602, 604.

Referring to FIG. 6B, the cell 602 is a combined cell formed of cells 21 and 22. The details of the cells 21 and 22 have been discussed with reference to previous figures, and will not be repeated for brevity. In some embodiments, the tap cell 606A or 606B includes some features, e.g., active regions OD arranged in the substrate layer 100, gate structures GT and front-side gate conductive lines F-CT arranged in the gate layer 130. In some embodiments, the tap cell 606A or 606B does not include any functional FETs, i.e., the gate structures GT formed in the tap cells 606A, 606B are not functional, in which the gate electrodes are either formed of dielectric materials, or are appropriately tied off. In some embodiments, the tap cells 606A, 606B each include the front-side interconnect structures 110 and the backside interconnect structures 120, in which the front-side interconnect structures 110 includes a first front-side conductive line 622 extending in the X-axis, and the backside interconnect structures 120 includes a first backside conductive line 624 extending in the X-axis. Further, at least one of the tap cells 606A, 606B includes a TSV 632 or 634 extending in the Y-axis and electrically connecting the first front-side conductive line 622 to the first backside conductive line 624.

In some embodiments, the TSV 632 is formed in place of a portion of a gate structure of the tap cell 606A. In some other embodiments, the TSV 634 is formed in place of a portion of a source/drain region of the tap cell 606B. The TSV 632 or 634 can also be arranged in other locations of the tap cell 606A or 606B. In some embodiments, the tap cell 606A or 606B includes a TSV 632 or 634 extending through the substrate layer 100 and electrically connecting the front-side interconnect structure 110 to the backside interconnect structure 120. Through the arrangement of the TSV 632 or 634, the front-side interconnect structure 110 can be electrically coupled to the backside interconnect structure 120 through an additional conduction path on the outside the cell 602. In some embodiments, the cell 604 and the cell 602 share the tap cell 606A, in which the first or second supply voltage can be provided to the front-side interconnect structures 110 of the cell 602 and 604 through the TSV 632 or 634. With help of the additional or alternative conduction path provided by the TSVs 632, 634, the sources of the first and second supply voltages can be fed into the cell 602 either through the front-side bond pads and the front-side interconnect structure 110, through the backside bond pads and the backside interconnect structure 120, or through both sides. The routing flexibility of the power mesh can be increased accordingly, and the overall power routing resistance may be further decreased.

In some embodiments, the tap cell 606 and the cell 602 of interest can be arranged in the same or different rows. For example, the tap cell 606C or 606D can be arranged in the row R1 or R3 and electrically connected to the cell 602 or 604. The placement flexibility and the tap cell sharing efficiency can be further improved.

FIGS. 7A-7E are cross-sectional views of intermediate stages of a method 700 of manufacturing a semiconductor device 70, in accordance with some embodiments of the present disclosure. It shall be understood that additional steps can be provided before, during, and after the steps shown in FIGS. 7A to 7E, and some of the steps described below can be replaced with other embodiments or eliminated. The order of the steps may be interchangeable. Some of the steps may be performed concurrently or independently.

Figure 7A:
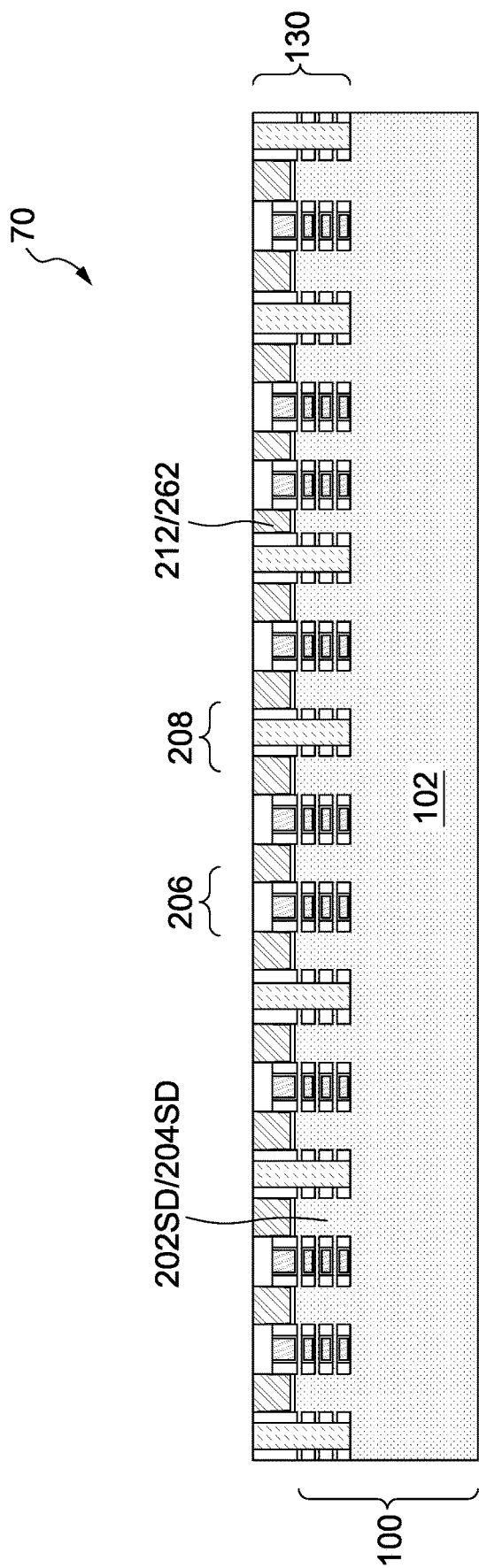
FIGS. 7A-7E are cross-sectional views of intermediate stages of a method of manufacturing a semiconductor device, in accordance with some embodiments of the present disclosure.

Referring to FIG. 7A, a substrate 102 is provided. The substrate 102 may include silicon, germanium, or other suitable elementary semiconductor materials. Alternatively, the substrate 102 may include a compound semiconductor, such as silicon carbide, gallium arsenide, indium arsenide, or indium phosphide. The substrate 102 may include different dopant types, such as P-type substrate or an N-type substrate, and may include various doping configurations depending on design requirements. Further, the substrate 102 may include an epitaxial layer (epi layer) or may include a silicon-on-insulator (SOI) structure.

The active regions 202 or 204, including the source/drain regions 202SD or 204SD, are formed in the substrate layer 100 on the front side of the substrate 102. Further, the gate structures 206, 208 and the front-side gate-layer conductive lines 212, 262 are formed in the gate layer 130 on the front side of the substrate 102. The configurations and materials of the active regions 202, 204, the gate structures 206, 208, and front-side gate-layer conductive lines 212, 262 are discussed in the previous paragraphs with reference to FIGS. 1A, 1B, 2A, 2B, and 3A through 3G, 4A, 4B and 5A through 5G.

Figure 7B:
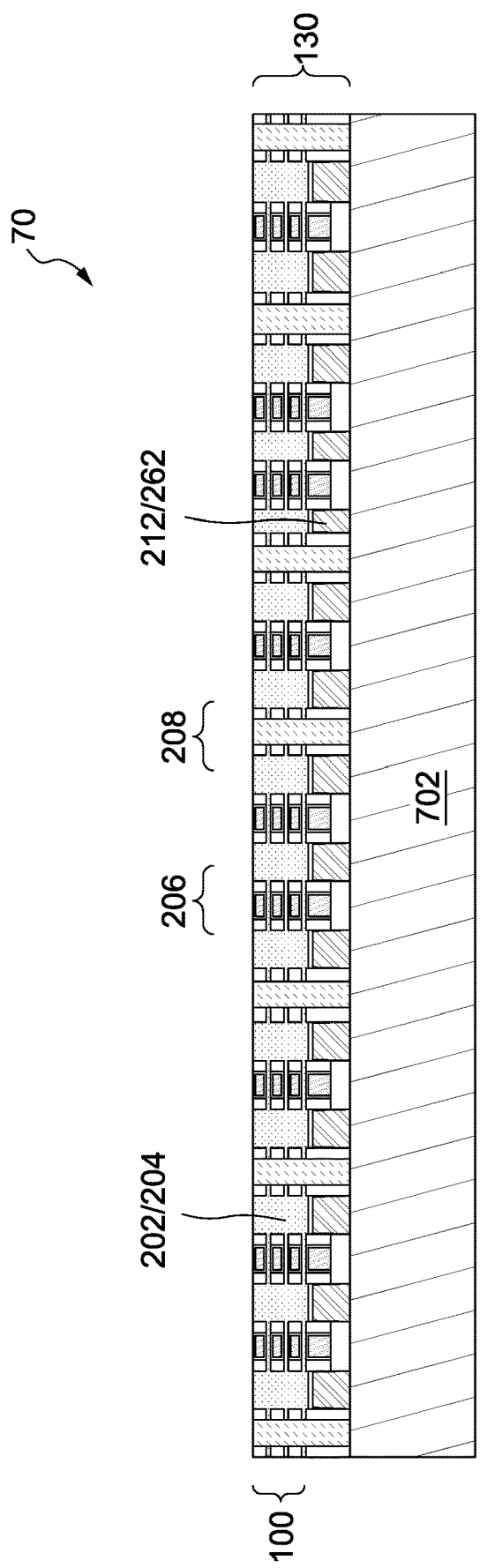

Referring to FIG. 7B, the substrate 102 is flipped. The front side of the substrate 102 faces downward and is bonded to a carrier substrate 702. The carrier substrate 702 may be formed of silicon, oxide, nitride, glass, ceramics, quartz, or other suitable materials. The substrate 102 is thinned from the backside thereof, and a backside of the substrate layer 100 including, e.g., the active region 202, 204 and the gate structures 206, 208, is exposed. The thinning operation of the substrate 102 may include a planarization operation, e.g., chemical mechanical polishing (CMP), a mechanical grinding, a dry etch, a wet etch, a reactive ion etch (RIE), or the like.

Figure 7C:
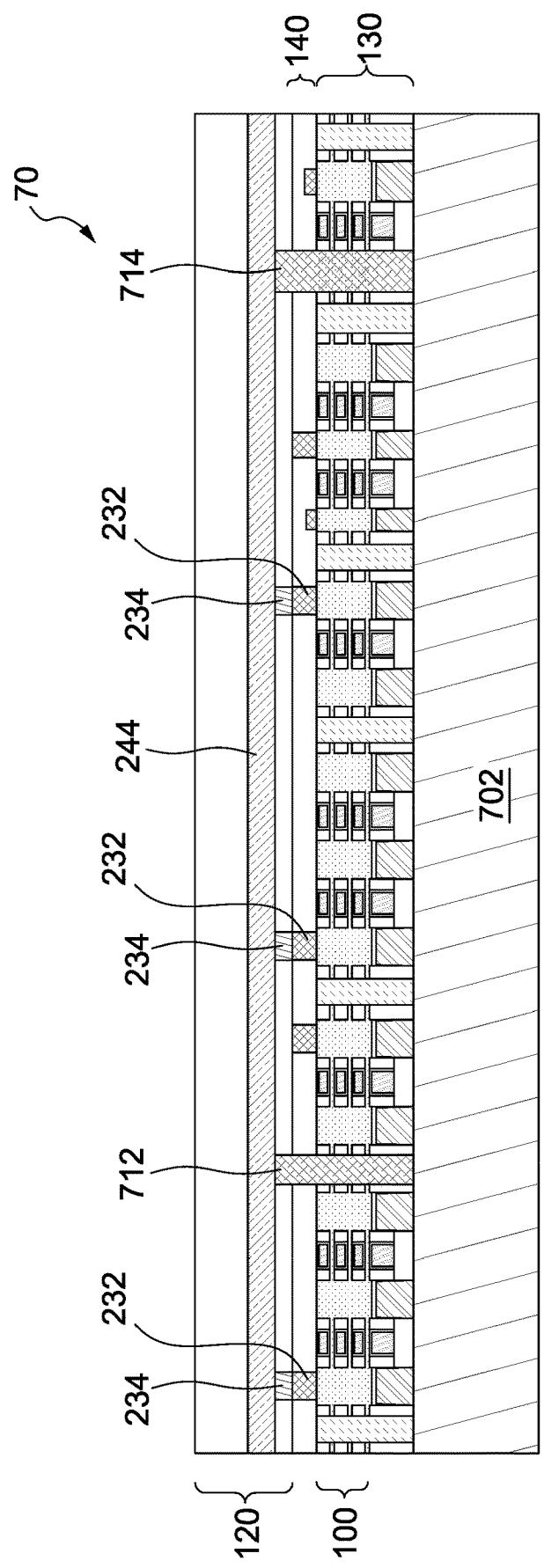

FIG. 7C illustrates the formation of the backside contact layer 140 and the backside interconnect structure 120 on the backside of the substrate layer 100. In some embodiments, the backside conductive lines 232 are formed in the backside contact layer 140. In some embodiments, the backside interconnect structure 120 is formed on the backside of the substrate layer 100, in which the backside conductive vias 234 and backside conductive lines 244 are formed in succession over the backside contact layer 140. In some embodiments, the TSVs 712 and 714 are formed through the substrate layer 100 and the backside contact layer 140 to extend to the backside conductive lines 244. As an exemplary process, the TSV 712 or 714 is formed by performing an etching operation to form a trench through the substrate layer 100, followed by deposition of conductive materials in the trench. The TSV 712 may be formed in place of a gate structure 206 or 208, and the TSV 714 may be formed in place of a source/drain region 204SD and a front-side gate-layer conductive line 212.

Figure 7D:
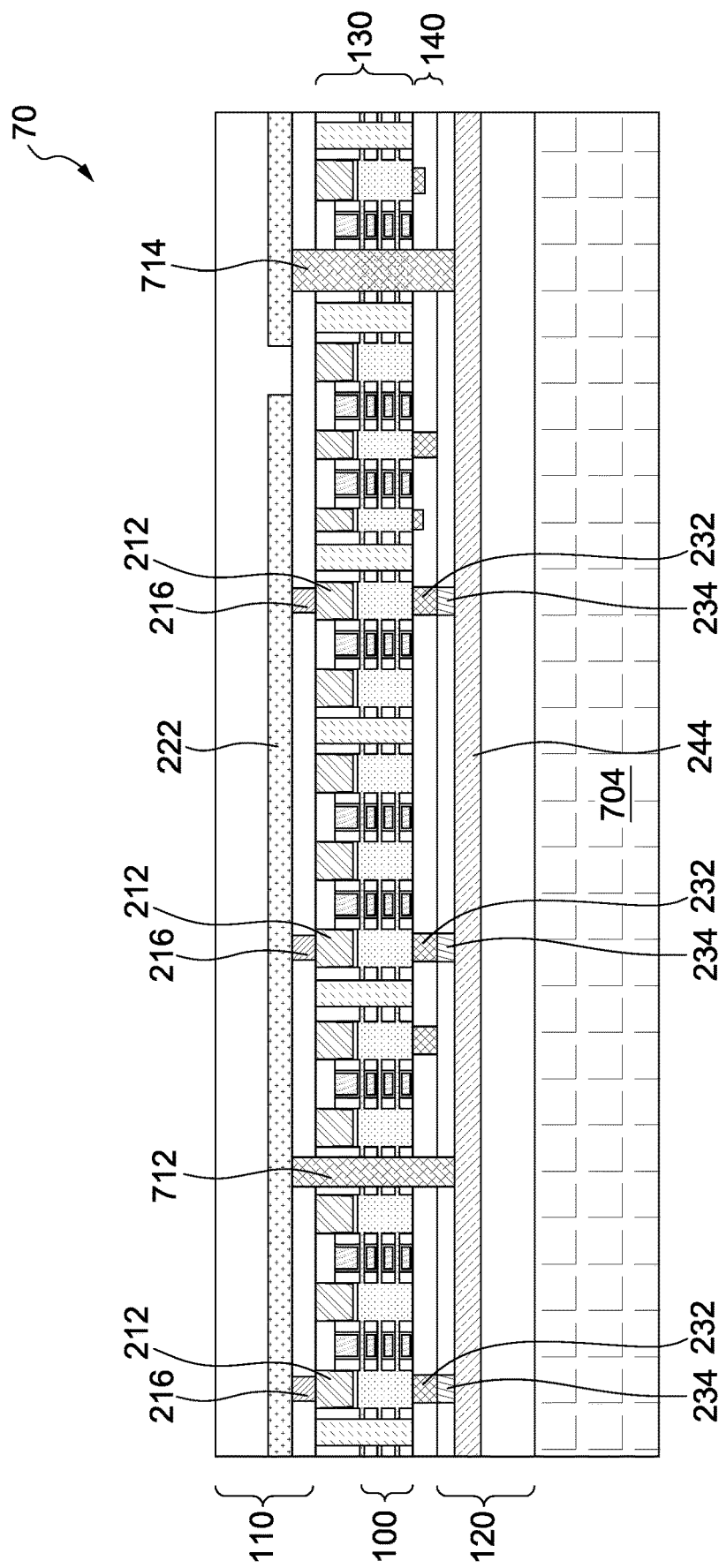

Referring to FIG. 7D, the substrate 102 is flipped back, and the backside of the substrate 102 is bonded to another carrier substrate 704. The carrier substrate 702 is removed or stripped using, e.g., an etching or stripping operation. The front sides of the gate structures 206 or 208 are exposed accordingly. In some embodiments, the front-side interconnect structure 110 is formed on the front side of the substrate layer 100, in which the front-side conductive vias 216 and front-side conductive lines 222 are formed in succession to be electrically connected to the gate structures 206, 208 and the front-side gate-layer conductive lines 212. In some embodiments, the TSVs 712 and 714 are reengineered to extend to the front-side conductive lines 222.

Figure 7E:
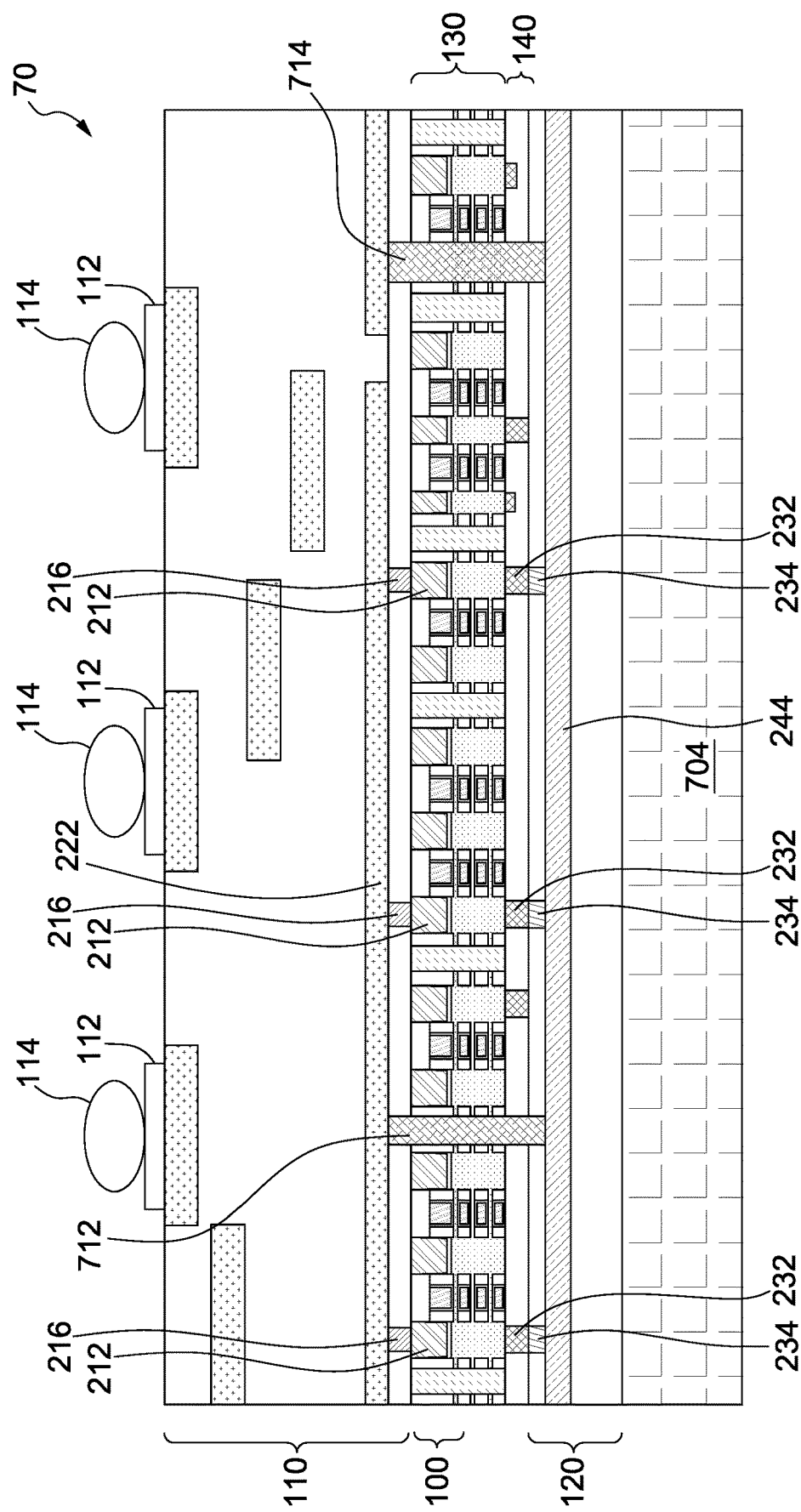

Referring to FIG. 7E, more front-side conductive line layers and front-side conductive vias of the front-side interconnect structure 110 are formed, in which the power mesh and signal routing are expanded in the front-side interconnect structure 110. In some embodiments, multiple conductive pads 112 and the connectors 114 are formed over the uppermost layer of the front-side interconnect structure 110 and electrically connected to the uppermost layer of the front-side conductive line layer 110M-X. In some embodiments, the carrier substrate 704 is removed or stripped after the semiconductor device 70 is completed.

In some embodiments, the first supply voltage and the second supply voltage can be provided from the connectors 114, through power meshes formed in the front-side interconnect structure 110 and the backside interconnect structure 120, and reach the FETs in the substrate layer 100 of the semiconductor devices 70. The source/drain regions 202SD or 204SD are formed as first conduction paths to electrically connect the front-side power mesh in the front-side interconnect structure 110 from the front side of the source/drain regions 202SD, 204SD, to the backside power mesh in the backside interconnect structure 120 from the backside of the source/drain regions 202SD, 204SD. Moreover, the TSVs 712 and 714 are formed as second conduction paths to electrically connect the front-side power mesh in the front-side interconnect structure 110 to the backside power mesh in the backside interconnect structure 120. The resistance or capacitance of the power mesh of the semiconductor device 70 can be effectively reduced due to the arrangement of the additional backside power mesh, and the electrical performance of the semiconductor device 70 can be improved.

FIGS. 8A-8E are cross-sectional views of intermediate stages of a method 800 of manufacturing a semiconductor device 80, in accordance with some embodiments of the present disclosure. It shall be understood that additional steps can be provided before, during, and after the steps shown in FIGS. 8A to 8E, and some of the steps described below can be replaced with other embodiments or eliminated. The order of the steps may be interchangeable. Some of the steps may be performed concurrently or independently. The method 800 may be similar to the method 700 in some aspects, and these similar features are not repeated for brevity.

Figure 8A:
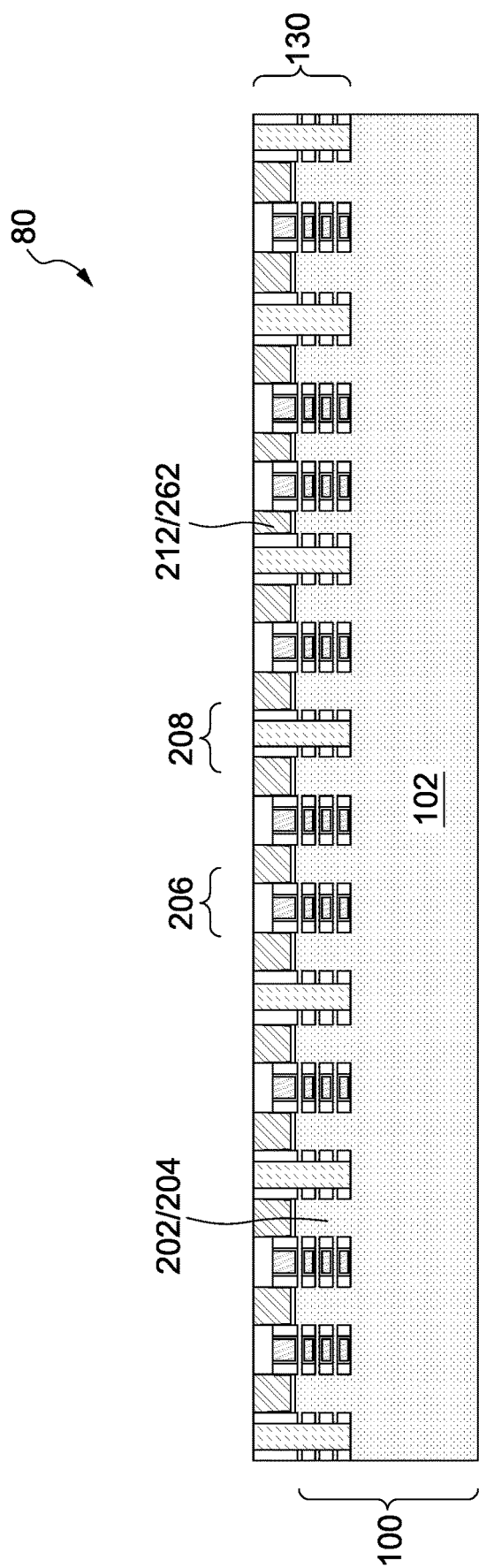
FIGS. 8A-8E are cross-sectional views of intermediate stages of a method of manufacturing a semiconductor device, in accordance with some embodiments of the present disclosure.

Referring to FIG. 8A, the substrate 102 is provided. The active regions 202 or 204, including the source/drain regions 202SD or 204SD, are formed in the substrate layer 100 on the front side of the substrate 102. Further, the gate structures 206, 208 and the front-side gate-layer conductive lines 212, 262 are formed in the gate layer 130 on the front side of the substrate 102.

Figure 8B:
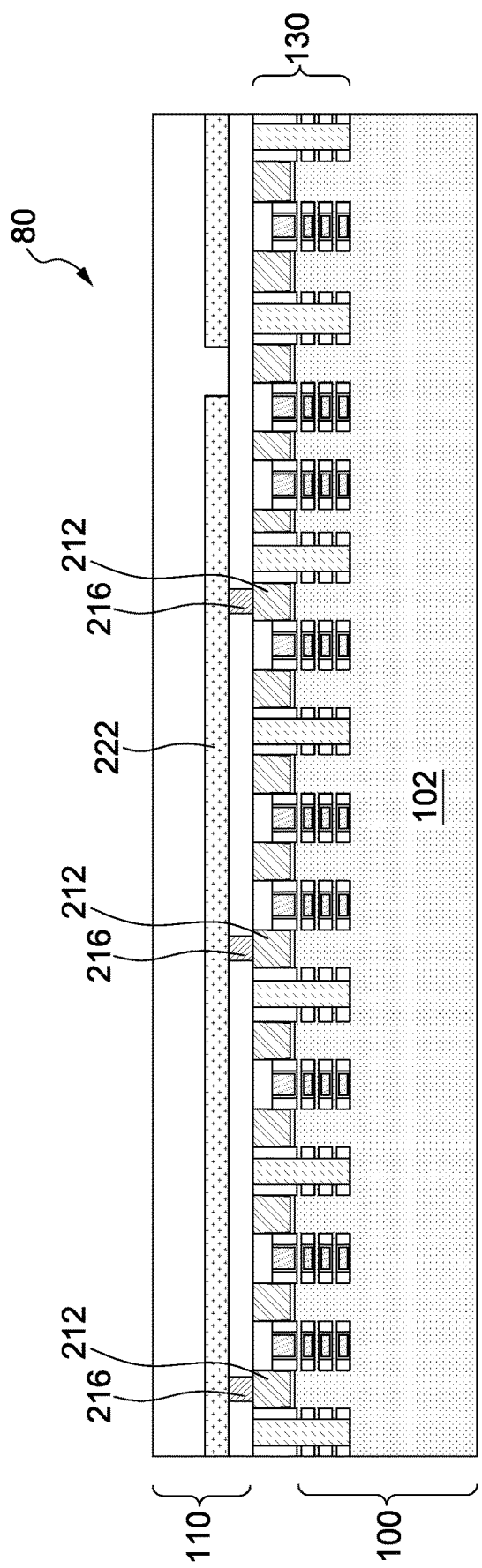

Referring to FIG. 8B, the front-side interconnect structure 110 is formed on the front side of the substrate layer 100, in which the front-side conductive vias 216 and front-side conductive lines 222 are formed in succession to be electrically connected to the gate structures 206, 208 and the front-side gate-layer conductive lines 212.

Figure 8C:
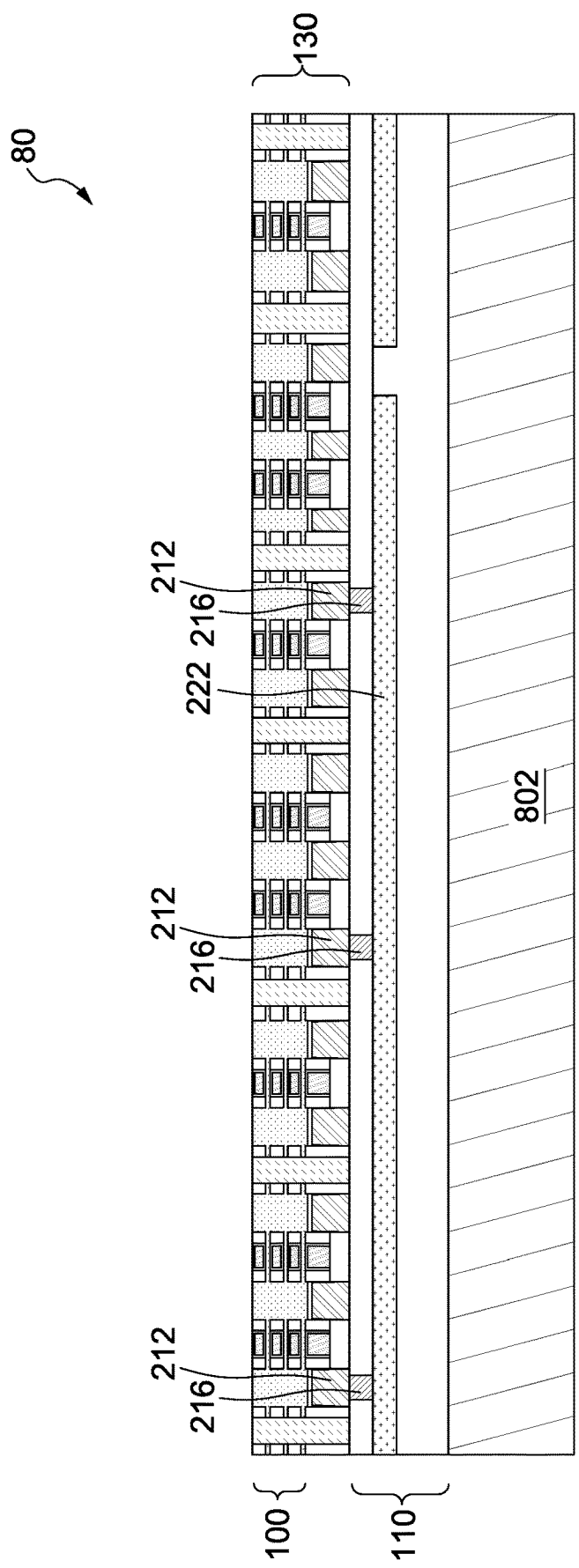

Referring to FIG. 8C, the substrate 102 is flipped, and the front side of the substrate 102 is bonded to a carrier substrate 802. The substrate 102 is thinned from the backside thereof, and a backside of the substrate layer 100, e.g., the active region 202, 204 is exposed. The thinning operation of the substrate 102 may include CMP, mechanical grinding, a dry etch, a wet etch, a reactive ion etch (RIE), or the like.

Figure 8D:
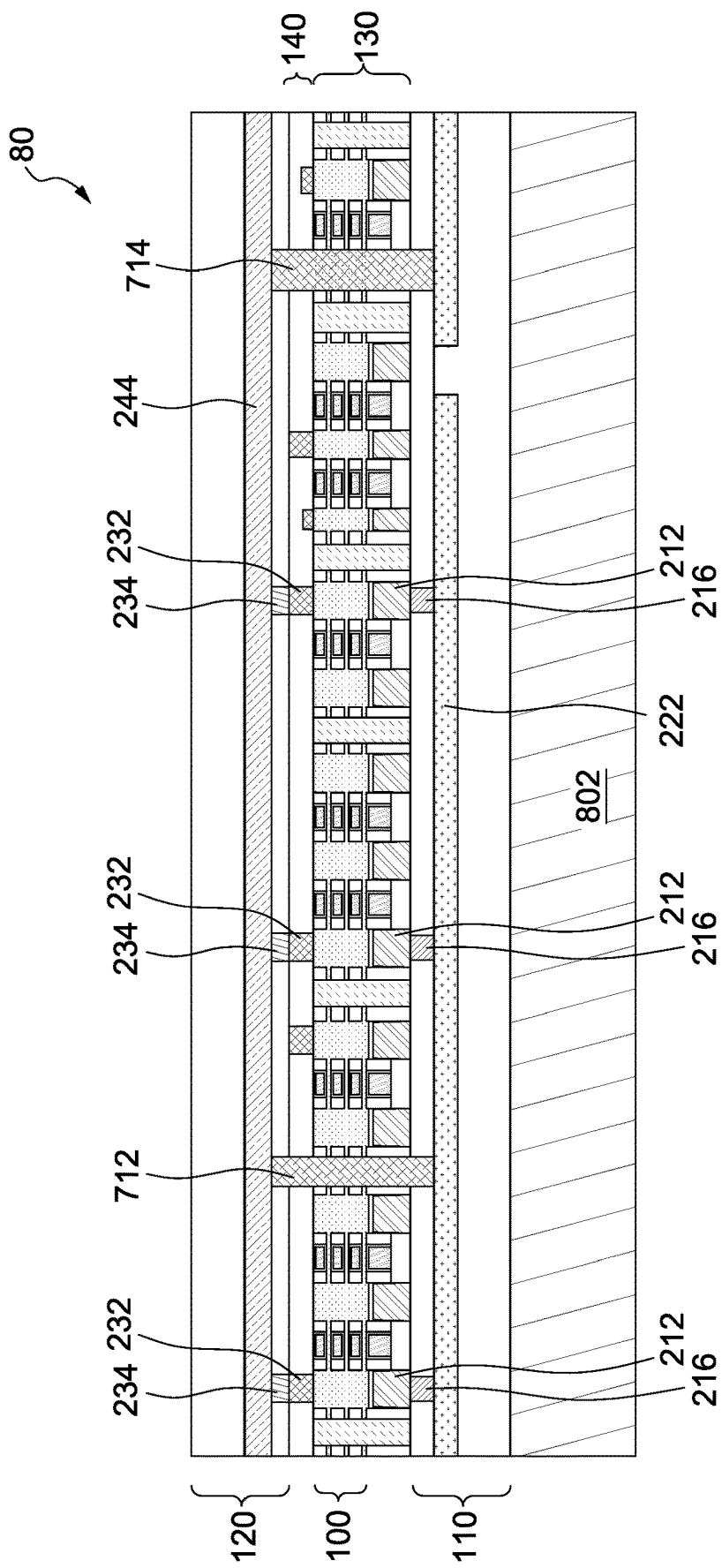

FIG. 8D illustrates the formation of the backside contact layer 140 and the backside interconnect structure 120 on the backside of the substrate layer 100. In some embodiments, the backside conductive lines 232 are formed in the backside contact layer 140. In some embodiments, the backside interconnect structure 120 is formed on the backside of the substrate layer 100, in which the backside conductive vias 234 and backside conductive lines 244 are formed in succession over the backside contact layer 140. In some embodiments, the TSVs 712 and 714 are formed through the substrate layer 100 and the backside contact layer 140 to extend to the backside conductive lines 244.

Figure 8E:
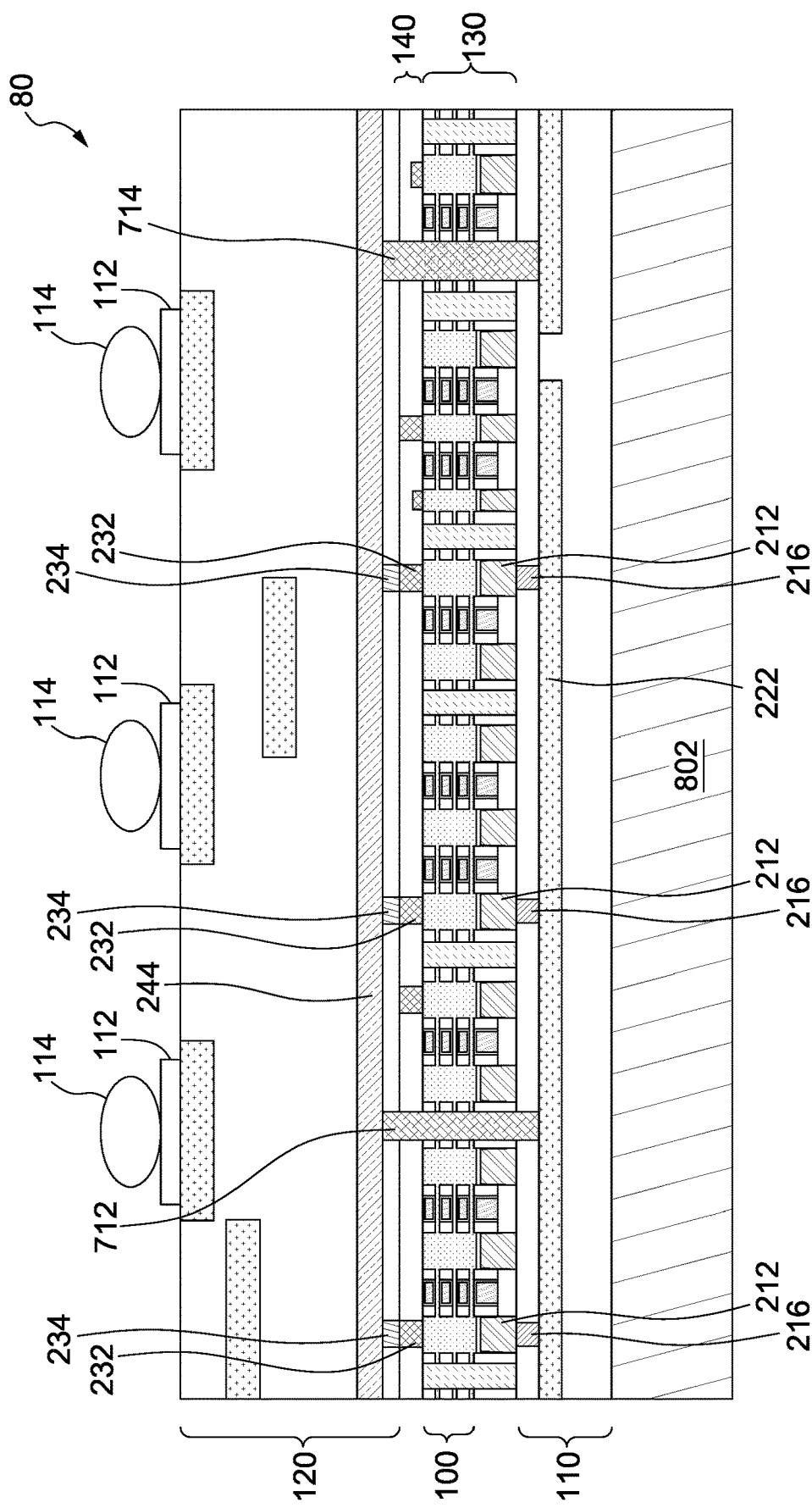

Referring to FIG. 8E, more backside conductive line layers and backside conductive via layers of the backside interconnect structure 120 are formed, in which the power mesh and signal routing are expanded in the backside interconnect structure 120. In some embodiments, multiple conductive pads 122 and the connectors 124 are formed over the uppermost layer of the backside interconnect structure 120 and electrically connected to the uppermost layer of the backside conductive line layer 120M-Y. In some embodiments, the carrier substrate 802 is removed or stripped after the semiconductor device 80 is completed.

In some embodiments, the first supply voltage and the second supply voltage can be provided from the connectors 124, through power meshes in the backside interconnect structure 120 and the front-side interconnect structure 110, and reach the FETs in the substrate layer 100 of the semiconductor devices 80. The source/drain regions 202SD or 204SD are formed as first conduction paths to electrically connect the backside power mesh in the backside interconnect structure 120 to the front-side power mesh in the front-side interconnect structure 110. Moreover, the TSVs 712 and 714 are formed as second conduction paths to electrically connect the backside power mesh in the backside interconnect structure 120 to the front-side power mesh in the front-side interconnect structure 110. The resistance or capacitance of the power mesh of the semiconductor device 80 can be effectively reduced due to the arrangement of the additional backside power mesh, and the electrical performance of the semiconductor device 80 can be improved.

Figure 9:
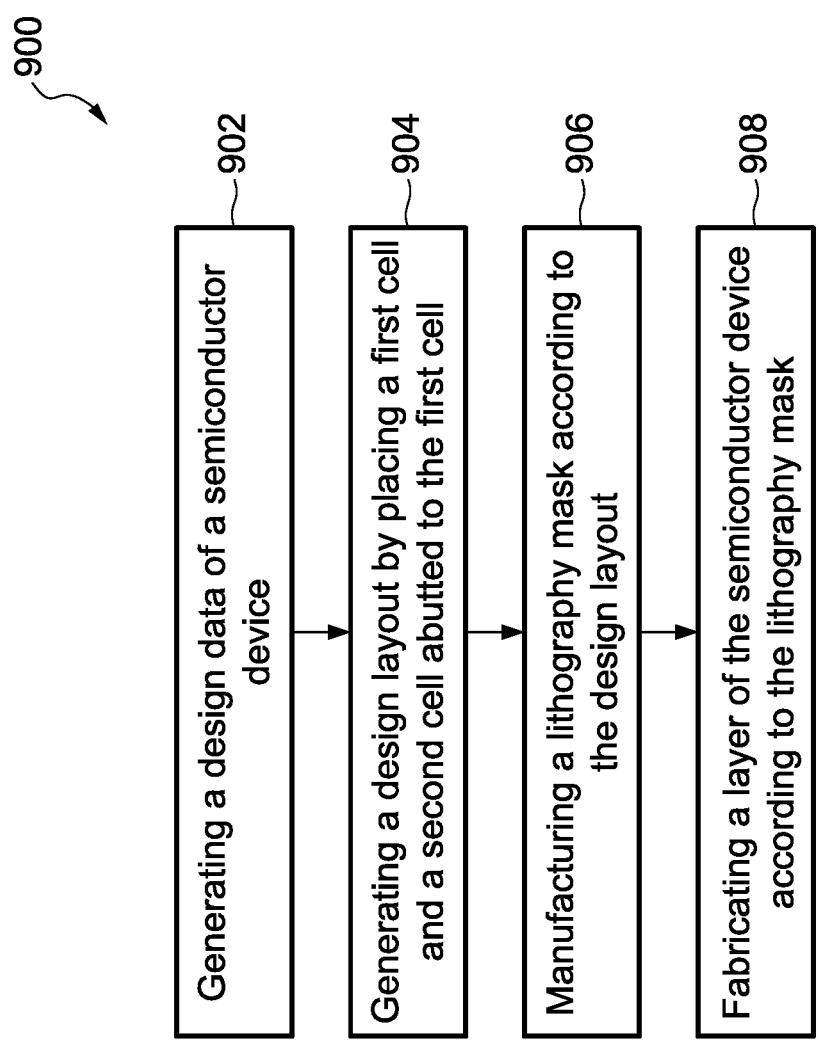
FIG. 9 is a flowchart of a method of manufacturing a semiconductor device, in accordance with some embodiments of the present disclosure.

FIG. 9 is a flowchart of a method 900 of manufacturing a semiconductor device, in accordance with some embodiments of the present disclosure. It shall be understood that additional steps can be provided before, during, and after the steps shown in FIG. 9, and some of the steps described below can be replaced with other embodiments or eliminated. The order of the steps may be interchangeable. Some of the steps may be performed concurrently or independently.

At step 902, a design data of a semiconductor device is generated. The design data may include an electronic circuit.

At step 904, a design layout is generated by placing a first cell and a second cell abutted to the first cell. In some embodiments, the first cell or the second cell includes a doped region extending in a first direction on a substrate in a substrate layer, a first functional gate electrode extending in a second direction over the doped region, a source/drain region on one side of the doped region in the substrate layer, and a first power rail arranged in a first layer over the substrate. The first power rail extends in the first direction and electrically coupled to a front side of the source/drain region. The first cell or the second cell further includes a second power rail in a third layer below the substrate and electrically coupled to the source/drain region.

At step 906, a lithography mask is manufactured according to the design layout. At step 908, a layer of the semiconductor device is fabricated according to the lithography mask.

Figure 10A:
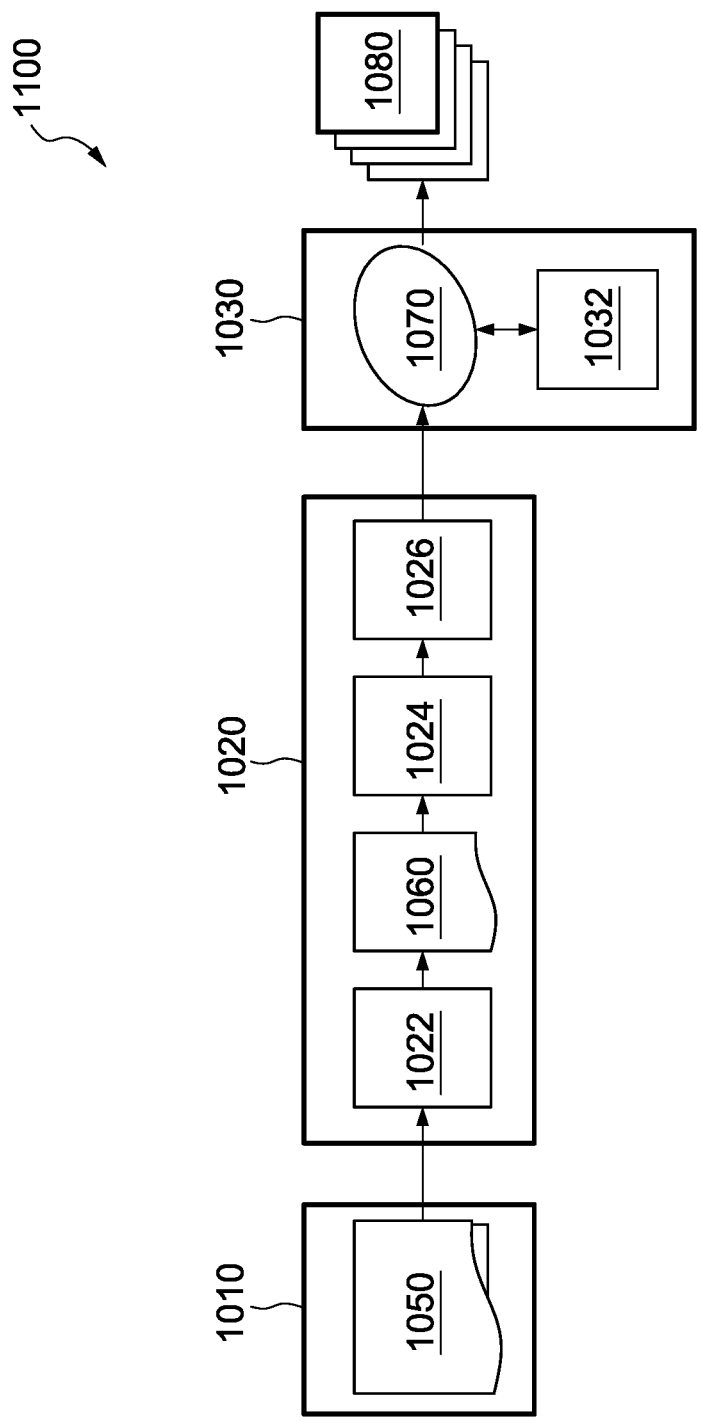
FIG. 10A is a schematic diagram showing an integrated circuit (IC) manufacturing system, in accordance with some embodiments.

FIG. 10A is a schematic diagram 1000 showing an integrated circuit (IC) manufacturing system, in accordance with some embodiments. The IC manufacturing system 1000 is configured to manufacture an IC device 1080 through a plurality of entities, such as a design subsystem 1010, a mask subsystem 1020, and a fabrication subsystem 1030. The entities in the IC manufacturing system 1000 may be linked by a communication channel, e.g., a wired or wireless channel, and interact with one another through a network, e.g., an intranet or the internet. In an embodiment, the design subsystem 1010, the mask subsystem 1020 and the fabrication subsystem 1030 belong to a single entity, or are operated by independent parties.

The design subsystem 1010, which may be provided by a design house or a layout design provider, generates a design layout 1050, e.g., the design layout 20, 40, in a design phase for the IC devices 1080 to be fabricated. The design subsystem 1010 may perform the layout methods discussed in the present disclosure to generate the design layout 1050, e.g., the design layouts shown with reference to the figures of the present disclosure. In an embodiment, the design subsystem 1010 operates a circuit design procedure to generate the design layout 1050. The design subsystem 1010 may include further one or more steps, such as logic design, physical design, pre-layout simulation, placement and routing, timing analysis, parameter extraction, design rule check and post-layout simulation, to generate the design layout 1050. The design layout 1050 may be converted from description texts into their visual equivalents to show a physical layout of the depicted patterns, such as the dimensions, shapes and locations thereof. In an embodiment, the design layout 1050 can be expressed in a suitable file format such as GDSII, DFII, OASIS, or the like.

The mask subsystem 1020 receives the design layout 1050 from the design subsystem 1010 and manufactures one or more masks (photomask, lithography masks or reticles) according to the design layout 1050. In an embodiment, the mask subsystem 1020 includes a mask data preparation block 1022, a mask fabrication block 1024 and a mask inspection block 1026. The mask data preparation block 1022 modifies the design layout 1050 so that a revised design layout 1060 can allow a mask writer to transfer the design layout 1050 to a writer-readable format.

The mask fabrication block 1024 is configured to fabricate the one or more masks by preparing a substrate based on the design layout 1060 provided by the mask data preparation block 1022. A mask substrate is exposed to a radiation beam based on the pattern of the design layout 1060 in a writing operation, which may be followed by an etching operation to leave the patterns corresponding to the design layout 1060. In an embodiment, the mask fabrication block 1024 includes a checking procedure to ensure that the design layout 1060 complies with requirements of a mask writer and/or a mask manufacturer to generate the mask as desired. An electron-beam (e-beam), multiple e-beams, an ion beam, a laser beam or other suitable writer source may be used to transfer the patterns.

After the one or more masks are fabricated, the mask inspection block 1026 inspects the fabricated masks to determine if any defects, such as full-height and non-full-height defects, exist in the fabricated mask. If any defects are detected, the mask may be cleaned or the design layout in the mask may be modified.

The fabrication subsystem 1030 is an IC manufacturing entity that includes multiple manufacturing facilities or tools for the fabrication of a variety of the IC devices 1080. The fabrication subsystem 1030 uses the mask fabricated by the mask subsystem 1020 to generate a wafer 1070 having a plurality of IC devices 1080 thereon. The wafer 1070 includes a semiconductor substrate and optionally various layers formed thereon. The operations provided by the manufacturing facilities or tools may include, but are not limited to, photolithography, deposition, sputtering, etching, cleaning, polishing, diffusion, ion implantation and annealing. In some embodiments, test structures may be formed on the wafer 1070 to generate test data indicative of the quality of the fabricated wafer 1070. In an embodiment, the fabrication subsystem 1030 includes a wafer testing block 1032 configured to ensure that the wafer 1070 conforms to physical manufacturing specifications and mechanical and/or electrical performance specifications. After the wafer 1070 passes the testing procedure performed by the wafer testing block 1032, the wafer 1070 may be diced (or sliced) along the scribe line regions to form separate IC devices 1080. The dicing process can be accomplished by scribing and breaking, by mechanical sawing (e.g., with a dicing saw) or by laser cutting.

Figure 10B:
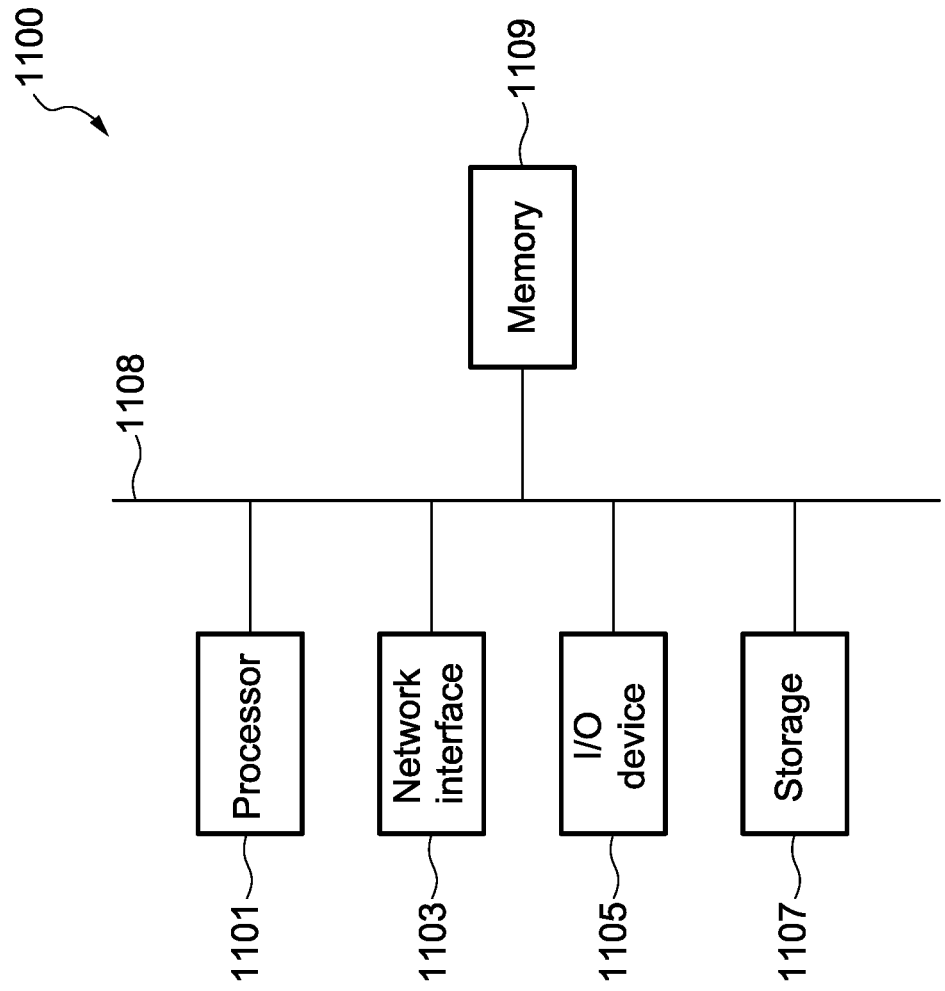
FIG. 10B is a schematic diagram of a system for implementing a design layout, in accordance with some embodiments.

FIG. 10B is a schematic diagram of a system 1100 for implementing or storing the design layouts discussed above, in accordance with some embodiments. The system 1100 includes a processor 1101, a network interface 1103, an input and output (I/O) device 1105, a storage device 1107, a memory 1109, and a bus 1108. The bus 1108 couples the network interface 1103, the I/O device 1105, the storage device 1107, the memory 1109 and the processor 1101 to each other.

The processor 1101 is configured to execute program instructions that include a tool configured to generate the design layouts as described and illustrated with reference to figures of the present disclosure.

The network interface 1103 is configured to access program instructions and data accessed by the program instructions stored remotely through a network (not shown).

The I/O device 1105 includes an input device and an output device configured to enable user interaction with the system 1100. In some embodiments, the input device includes, for example, a keyboard, a mouse, and other devices. Moreover, the output device includes, for example, a display, a printer, and other devices.

The storage device 1107 is configured for storing the design layouts, one or more cell libraries including the configurations and settings of the standard cells as discussed previously, program instructions and data accessed by the program instructions. In some embodiments, the storage device 1107 includes a non-transitory computer-readable storage medium, for example, a magnetic disk and an optical disk.

The memory 1109 is configured to store program instructions to be executed by the processor 1101 and data accessed by the program instructions. In some embodiments, the memory 1109 includes any combination of a random access memory (RAM), some other volatile storage device, a read-only memory (ROM), and some other non-volatile storage device.

In accordance with some embodiments of the present disclosure, a method is provided. The method includes forming a doped region extending in a first direction on a substrate; depositing a gate electrode over the substrate and extending in a second direction; and forming a source/drain region on one side of the doped region; forming a first power rail over an upper surface of the source/drain region, the first power rail extending in the first direction and electrically coupled to the source/drain region; and depositing a second power rail below a lower surface of the source/drain region, the second power rail extending in the first direction and electrically coupled to the source/drain region. The first power rail overlap the second power rail from a top-view perspective.

In accordance with some embodiments of the present disclosure, a method is provided. The method includes placing a first cell and a second cell in a design layout. the first cell includes a doped region extending in a first direction on a substrate in a substrate layer; a first gate structure extending in a second direction over the doped region; a source/drain region on one side of the doped region in the substrate layer; a first power rail arranged in a first layer over the substrate, the first power rail extending in the first direction and electrically connected to a front side of the source/drain region; and a second power rail in a second layer below the substrate and electrically connected to a backside of the source/drain region. The second cell is abutted to the first cell and includes a third power rail arranged in the first layer and electrically connected to the first power rail; a fourth power rail arranged in the second layer and electrically connected to the second power rail; and a conductive via extending thorough the substrate and electrically coupling the third power rail to the fourth power rail.

In accordance with some embodiments of the present disclosure, a semiconductor structure includes: a doped region extending in a first direction on a substrate in a substrate layer; a first gate structure arranged over the substrate and extending in a second direction over the substrate layer; two source/drain regions on two sides of the doped region in the substrate layer; a first power rail in a first layer over an upper surface of the source/drain region, the first power rail extending in the first direction and electrically connected to the source/drain region; and a second power rail in a third layer below the substrate layer, the second power rail extending in the first direction and electrically connected to the source/drain region. The second power rail has a width measured in the second direction greater than that of the first power rail.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a doped region extending in a first direction on a substrate;
    depositing a gate electrode over the substrate and extending in a second direction;
    forming a source/drain region on one side of the doped region;
    forming a first power rail over an upper surface of the source/drain region, the first power rail extending in the first direction and electrically coupled to the source/drain region; and
    depositing a second power rail below a lower surface of the source/drain region, the second power rail extending in the first direction and electrically coupled to the source/drain region,
    wherein the first power rail overlaps the second power rail from a top-view perspective.

2. The method of claim 1, further comprising forming a first conductive via over the first power rail, the first power rail being operable to receive a first supply voltage.

3. The method of claim 2, further comprising positioning a first carrier substrate over the substrate and flipping the substrate, wherein the second power rail is deposited subsequent to the flipping of the substrate.

4. The method of claim 3, further comprising thinning a backside of the substrate before depositing the second power rail.

5. The method of claim 4, wherein the thinning of the substrate comprises exposing a backside of the source/drain region.

6. The method of claim 3, further comprising forming a second carrier substrate over the second power rail and flipping back the substrate, wherein the first power rail and the first conductive via are formed subsequent to the flipping back of the substrate.

7. The method of claim 1, further comprising forming a second conductive via extending through the substrate and electrically connecting the first power rail and the second power rail to each other.

8. The method of claim 1, further comprising:
depositing a first dielectric layer below a backside of the substrate; and
forming a third conductive via through the first dielectric layer and electrically connecting the source/drain region to the second power rail.

9. The method of claim 8, further comprising:
depositing a second dielectric layer on the backside of the substrate prior to the depositing of the first dielectric layer; and
forming a backside conductive line extending in the second dielectric layer, the backside conductive line electrically connecting the source/drain region to the third conductive via.

10. The method of claim 1, further comprising:
forming a backside interconnect structure on a backside of the substrate, the second power rail included in the backside interconnect structure; and
forming a connector below the backside interconnect structure and electrically coupling a second supply voltage to the second power rail.

11. A method, comprising:
placing a first cell arranged in a design layout, the first cell comprising:
a doped region extending in a first direction on a substrate in a substrate layer;
a first gate structure extending in a second direction over the doped region;
a source/drain region on one side of the doped region in the substrate layer;
a first power rail arranged in a first layer over the substrate, the first power rail extending in the first direction and electrically connected to a front side of the source/drain region; and
a second power rail in a second layer below the substrate and electrically connected to a backside of the source/drain region; and
placing a second cell arranged in the design layout and abutted to the first cell, the second cell comprising:
a third power rail arranged in the first layer and electrically connected to the first power rail;
a fourth power rail arranged in the second layer and electrically connected to the second power rail; and
a conductive via extending through the substrate and electrically coupling the third power rail to the fourth power rail.

12. The method of claim 11, wherein the first cell further comprises a second gate structure extending in the second direction and arranged on a boundary between the first cell and the second cell, the second gate structure comprising a first portion overlapping the doped region horizontally and electrically connected to the first power rail.

13. The method of claim 12, wherein the second gate structure comprises a second portion aligned with the first portion vertically and electrically connected to the second power rail.

14. The method of claim 11, wherein the first cell further comprises a third gate structure extending in the second direction and arranged at a cell boundary of the first cell or the second cell, the third gate structure comprising a gate electrode formed of a dielectric material.

15. The method of claim 11, wherein the first power rail and the second power rail are operable to receive a first supply voltage.

16. The method of claim 11, wherein the doped region comprises a plurality of nanosheets wrapped around by the first gate structure and having a side covered by the source/drain region.

17. A method, comprising:
forming a gate electrode over a doped region and extending in a second direction, the doped region extending in a first direction transverse the second direction;
forming a source/drain region on one side of the doped region;
forming a first power rail over an upper surface of the source/drain region and electrically coupled to the source/drain region; and
forming a second power rail below a lower surface of the source/drain region and electrically coupled to the source/drain region,
wherein the first power rail overlaps the second power rail from a top-view perspective.

18. The method of claim 17, further comprising:
forming a cell-edge gate structure extending in the second direction, wherein the cell-edge gate structure is between a conductive via and the gate structure.

19. The method of claim 18, further comprising:
forming a conductive pad on a lower side of the second power rail and configured to provide a supply voltage to the second power rail.

20. The method of claim 17, further comprising:
forming a conductive pad on a lower side of the second power rail and configured to provide a supply voltage to the second power rail.

* * * * *